United States Patent
Yang et al.

(10) Patent No.: US 11,741,285 B2
(45) Date of Patent: Aug. 29, 2023

(54) SEMICONDUCTOR DEVICE AND METHOD OF MANUFACTURING THE SAME

(71) Applicant: Samsung Electronics Co., Ltd., Suwon-si (KR)

(72) Inventors: Giyoung Yang, Seoul (KR); Ingyum Kim, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 17/361,854

(22) Filed: Jun. 29, 2021

(65) Prior Publication Data

US 2022/0058327 A1 Feb. 24, 2022

(30) Foreign Application Priority Data

Aug. 18, 2020 (KR) .................. 10-2020-0103161

(51) Int. Cl.
*G06F 30/392* (2020.01)
*G06F 30/396* (2020.01)
*H01L 27/088* (2006.01)

(52) U.S. Cl.
CPC .......... *G06F 30/392* (2020.01); *G06F 30/396* (2020.01); *H01L 27/0886* (2013.01)

(58) Field of Classification Search
USPC ........................................................ 716/120
See application file for complete search history.

(56) References Cited

U.S. PATENT DOCUMENTS

| 8,698,205 B2* | 4/2014 | Tzeng ............... H01L 27/11807 257/574 |
| 8,728,892 B2* | 5/2014 | Ou .................. H01L 21/823431 257/E29.026 |
| 9,576,978 B2* | 2/2017 | Baek .................... H01L 23/5286 |
| 10,497,693 B1* | 12/2019 | Huang ................ H01L 27/0924 |
| 2016/0055285 A1* | 2/2016 | Baek ...................... G06F 30/392 716/122 |
| 2019/0148407 A1* | 5/2019 | Guo .................. H01L 27/11807 257/206 |
| 2020/0006335 A1 | 1/2020 | Zhuang et al. |
| 2020/0006481 A1 | 1/2020 | Yang et al. |
| 2022/0058327 A1* | 2/2022 | Yang ..................... G06F 30/392 |
| 2023/0004857 A1* | 1/2023 | Shoham ................. G06F 18/23 |

* cited by examiner

*Primary Examiner* — Mohammed Alam
(74) *Attorney, Agent, or Firm* — Muir Patent Law, PLLC

(57) ABSTRACT

A semiconductor device includes a substrate having an active region, first standard cells arranged in a first row on the active region, second standard cells arranged in a second row on the active region and having a first boundary with the first standard cells, a third standard cells arranged in a third row on the active region and having a second boundary with the first standard cells, and a plurality of power supply lines, respectively arranged along boundaries. Each of the first to third standard cells includes a plurality of fin patterns extending in the first direction, and the plurality of fin patterns are arranged in a second direction, so as not to be disposed on at least one boundary, among the first and second boundaries.

20 Claims, 33 Drawing Sheets

SEMICONDUCTOR DEVICE AND METHOD OF MANUFACTURING THE SAME

CROSS-REFERENCE TO RELATED APPLICATION(S)

This application claims benefit of priority to Korean Patent Application No. 10-2020-0103161 filed on Aug. 18, 2020 in the Korean Intellectual Property Office, the disclosure of which is herein incorporated by reference in its entirety.

BACKGROUND

The present inventive concept relates to a semiconductor device.

As the demand for high performance, high speed, and/or multifunctionality in semiconductor devices has increased, the integration density of semiconductor devices has increased. With the trend for high density of semiconductor devices, various studies have been conducted to increase the degree of design freedom.

SUMMARY

Example embodiments provide a semiconductor device having improved integration density and reliability. Example embodiments also provide methods for manufacturing the semiconductor device.

According to an embodiment of the present inventive concept, a semiconductor device includes a substrate having an active region, a first group of standard cells arranged in a first row region of the active region, the first row region of the active region extending lengthwise in a first direction, a second group of standard cells arranged in a second row region of the active region, the second row region extending lengthwise in the first direction along a first side of the first row region, and a first boundary extending in the first direction and being formed between the first row region and the second row region, a third group of standard cells arranged in a third row region of the active region, the third row region extending lengthwise in the first direction along a second side of the first row region, a second boundary extending in the first direction and being formed between the first row region and the third row region, and the first side of the first row region and the second side of the first row region being opposite with each other in a second direction different from the first direction, a first power supply line extending lengthwise in the first direction along the first boundary between the first row region and the second row region, and overlapping partially each of the first row region and the second row region, and a second power supply line extending lengthwise in the first direction along the second boundary between the first row region and the third row region, and overlapping partially each of the first row region and the third row region. Each of the first to third groups of standard cells comprises a plurality of transistors including a plurality of active fins which is provided with the active region. The plurality of active fins protrude from a main surface of the active region and extend in the first direction. The plurality of active fins are spaced apart from each other in the second direction without overlapping the first and second boundaries.

According to an embodiment of the present inventive concept, a semiconductor device includes a substrate having an active region, a plurality of standard cells arranged in a plurality of row regions of the active region, each of the plurality of row regions extending lengthwise in a first direction, and the plurality of row regions being arranged in a second direction different from the first direction, each of the plurality of standard cells comprising a plurality of transistors including a plurality of active fins which are provided with the active region, the plurality of active fins protruding from a main surface of the active region and extending lengthwise in the first direction, each of the plurality of row regions including a first boundary with its upper row region and a second boundary with its lower row region, and each of the first boundary and the second boundary extending lengthwise in the first direction, a plurality of power supply lines extending lengthwise in the first direction along first and second boundaries of the plurality of row regions and being spaced apart, in the second direction, from each other, each of the plurality of power supply lines partially overlapping each of corresponding two adjacent row regions among the plurality of row regions, and a plurality of interconnection lines disposed above the plurality of standard cells and electrically connected to the plurality of standard cells. Each of the plurality of row regions of the active region comprises a first active region doped with an impurity of a first conductivity type and a second active region doped with an impurity of a second conductivity type which is different from the first conductivity type. The first active region and the second active region of each of the plurality of row regions of the active region are arranged in the second direction. The plurality of active fins which are disposed in each of the plurality of row regions comprise a first active fin disposed in the first active region of each of the plurality of row regions, and a second active fin disposed in the second active region of each of the plurality of row regions. A first distance between a first boundary of a first row region among the plurality of row regions and the first active fin among a plurality of active fins disposed in the first row region is different from a second distance between a second boundary of the first row region and the second active fin among the plurality of active fins disposed in the first row region.

According to an embodiment of the present inventive concept, a semiconductor device includes a substrate having an active region, a plurality of standard cells arranged in a plurality of row regions, each of the plurality of row regions extending lengthwise in a first direction, and the plurality of row regions being arranged in a second direction different from the first direction, each of the plurality of standard cells comprising a plurality of transistors including a plurality of active fins which are provided with the active region, a plurality of gate structures, a plurality of first source/drain regions, a plurality of second source/drain regions, and a plurality of contact structures, the plurality of active fins protruding from a main surface of the active region and extending lengthwise in the first direction, the plurality of gate structures extending lengthwise in the second direction and overlapping the plurality of active fins, the plurality of first source/drain regions and the plurality of second source/drain regions being disposed in a plurality of first regions of the plurality of active fins and a plurality of second regions of the plurality of active fins, respectively, the plurality of first regions and the plurality of second regions being disposed on opposite sides of each of the plurality of gate structures, and the plurality of contact structures comprising a plurality of first contact structures connected to the plurality of first source/drain regions, and a plurality of second contact structures connected to the plurality of second source/drain regions, and a plurality of power supply lines extending lengthwise in the first direction along boundaries of the plurality of row regions, and disposed one by one on in the second direction. Each of the plurality of power supply lines is shared by a plurality of standard cells disposed in each of corresponding two adjacent row regions among the plurality of row regions. A dummy fin is disposed in a first row region among the plurality of row regions and extends lengthwise in the first direction. The shortest distance between the dummy fin and a boundary of the first row region is smaller than the shortest distance between the boundary of the first row region and a first active fin, closest to the boundary, among a plurality of active fins in the first row region. The dummy fin is spaced apart, in the second direction, from a first power supply line among the plurality of power supply lines without overlapping the first power supply line. The first power supply line overlaps the boundary of the first row region.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
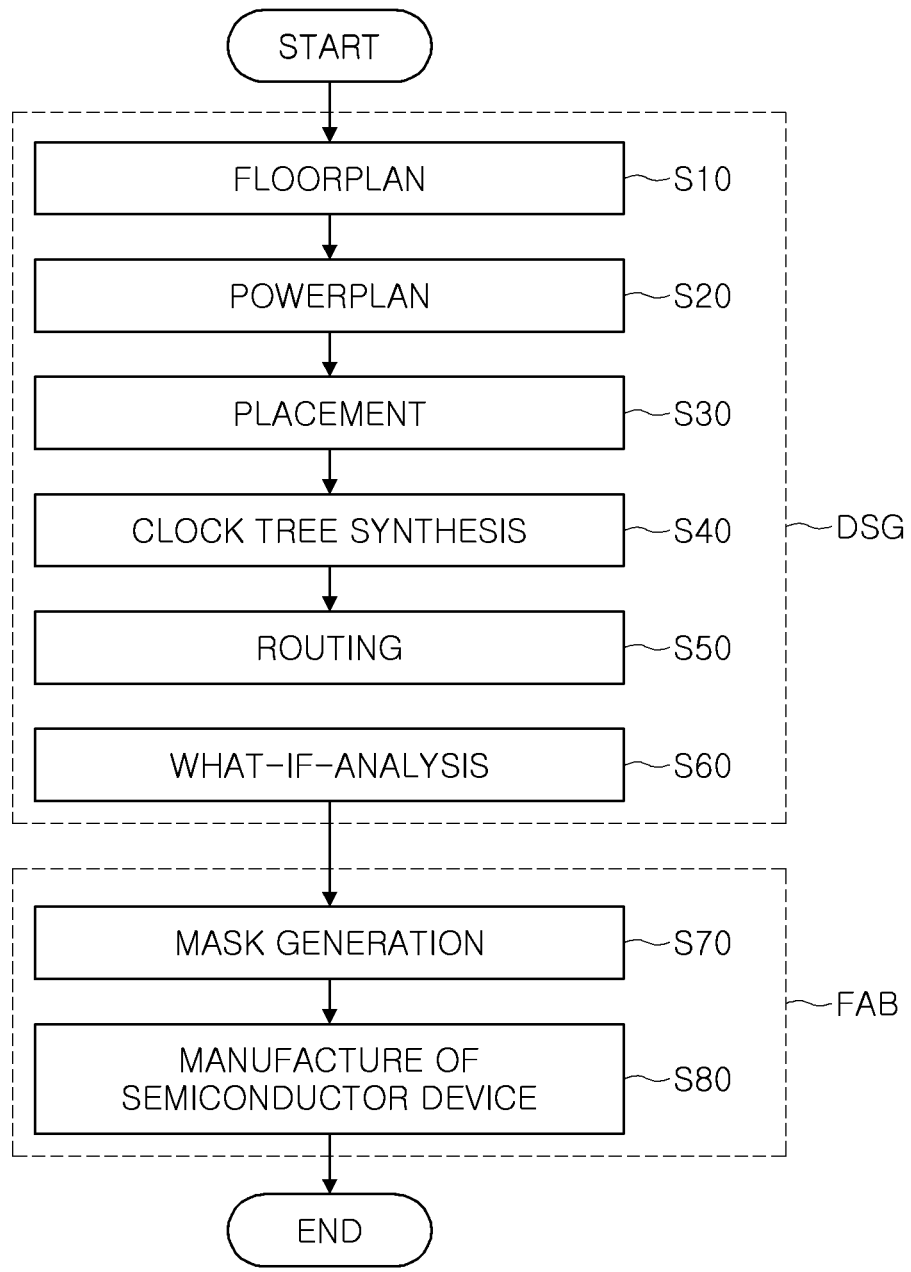
FIG. 1 is a flowchart illustrating a method of manufacturing a semiconductor device according to an example embodiment.

FIG. 1 is a flowchart illustrating a method of manufacturing a semiconductor device according to an example embodiment.

Referring to FIG. 1, a method of manufacturing a semiconductor device according to the present embodiment may include a design step DSG of the semiconductor device and a fabrication process step FAB of the semiconductor device.

The design step DSG may be a step of designing a layout for a circuit, and may be performed using a tool for circuit design. The tool may be a program including a plurality of instructions executed by a processor. Accordingly, the design step DSG may be a computer implemented step for circuit design. The fabrication process step FAB may be a step of fabricating a semiconductor device based on a designed layout, and may be performed by a semiconductor process module.

The design step DSG may include a floorplan step S10, a powerplan step S20, a placement step S30, and a clock tree synthesis (CTS) step S40, a routing step S50, and a what-if-analysis step S60.

The floorplan step S10 may be a step of cutting and transporting a logically designed schematic circuit to be physically designed. In the floorplan step S10, a memory or functional blocks may be disposed. In this step, for example, functional blocks which will be placed adjacent to each other may be identified, and the functional blocks may be assigned in consideration of an available space and required performance. For example, the floorplan step S10 may include a step of generating a site-row and a step of forming a metal routing track on the generated site-row. The site-row may be a frame for placing standard cells stored in a cell library, based on a specified design rule. Standard cells, each having the same height, may be placed in each site-row. Some site-rows may provide a site for placing the standard cells to have a height different from a height of standard cells of other site-rows. In the fabrication step FAB which will be later described, the site-rows will be transferred onto row regions of a substrate. For example, in each row region, the standard cells of a corresponding site-rows will be formed using transistors, for example.

The powerplan step S20 may be a step of placing patterns of interconnections connecting local power, for example, a driving voltage source or ground, in the disposed functional blocks. For example, patterns of interconnections connecting power or grounds may be formed in the form of a net (i.e., a mesh) such that the power is uniformly supplied to entire chip. In the specification, the patterns may also be referred to as a power rail or a power line. In the present step, the interconnections may be formed in the form of a net through various placement rules of the interconnection patterns.

The placement step S30 may be a step of placing patterns of elements constituting the functional block, and may include a step of placing standard cells. In some embodiments, each of the standard cells may include semiconductor elements (e.g., transistors) and first interconnection lines connected to the semiconductor elements. The first interconnection lines may include a power transmission line connected to power or ground, and an interconnection line transmitting a control signal, an input signal, or an output signal. Empty regions in each row-site may be present between standard cells placed in the placement step S30, and may be filled with filler cells. Unlike standard cells including an operable semiconductor element and a unit circuit implemented by semiconductor elements, the filler cells may be dummy regions. After completing the placement step S30, a shape or a size of a pattern for transistors and interconnections to be formed on a semiconductor substrate may be defined. For example, layout patterns such as a PMOS, an NMOS, an N-WELL, a gate electrode, and interconnections to be disposed thereon may be appropriately placed to form an inverter circuit, for example, on an actual semiconductor substrate.

The CTS step S40 may be a step of forming patterns of signal lines of a center clock related to a response time determining performance of a semiconductor device. The routing step S50 may be a step of forming an upper interconnection structure or a routing structure including second interconnection lines connecting the placed standard cells. For example, in this step, a power distribution network (PDN) may be implemented. The second interconnection lines may be electrically connected to the first interconnection lines in the standard cells, and the standard cells may be electrically connected to each other or may be connected to power or ground. The second interconnection lines may be physically formed above the first interconnection lines.

The what-if-analysis step S60 may be a step of verifying and correcting the generated layout. Items to be verified may include design rule check (DRC) verifying whether a layout generated meets a design rule, electrical rule check (ERC) verifying whether circuits implemented with the layout generated are properly connected with each other without electrical disconnection, and layout vs schematic (LVS) checking whether the layout matches a gate-level net list.

The fabrication process step FAB may include a mask generation step S70 and a semiconductor device manufacturing step S80.

The mask generation step S70 may include a step of performing optical proximity connection (OPC), or the like, on layout data generated in the design step DSG to generate mask data for forming various patterns on a plurality of layers and a step of generating a mask based on the mask data. The OPC may modify mask patterns formed using the layout to increase the printability on the semiconductor substrate. The mask may be generated in a manner of drawing layout patterns using a chromium thin film applied on a glass substrate or a quartz substrate.

In the semiconductor device manufacturing step S80, various types of exposure and etching processes may be performed repeatedly. Such processes may be performed repeatedly to sequentially form shapes of the patterns according to a layout generated during the layout design, on a semiconductor substrate such as silicon. For example, various semiconductor processes may be performed on a semiconductor substrate such a wafer using a plurality of masks to form a semiconductor device in which integrated circuits are implemented. The semiconductor process, employed in the present embodiment, may be performed by a lithography process using light such as extreme ultraviolet (EUV). Masks may have patterns which are generated using a lithography process. The semiconductor process may include a deposition process, an etching process, an ion implantation process, a cleaning process, and the like. The semiconductor process may further include a packaging process in which a semiconductor device is mounted on a printed circuit board (PCB), and then encapsulated by an encapsulant, and a test process for screening a faulty device from the semiconductor device or a package thereof manufactured in the fabrication process step FAB.

Figure 2:
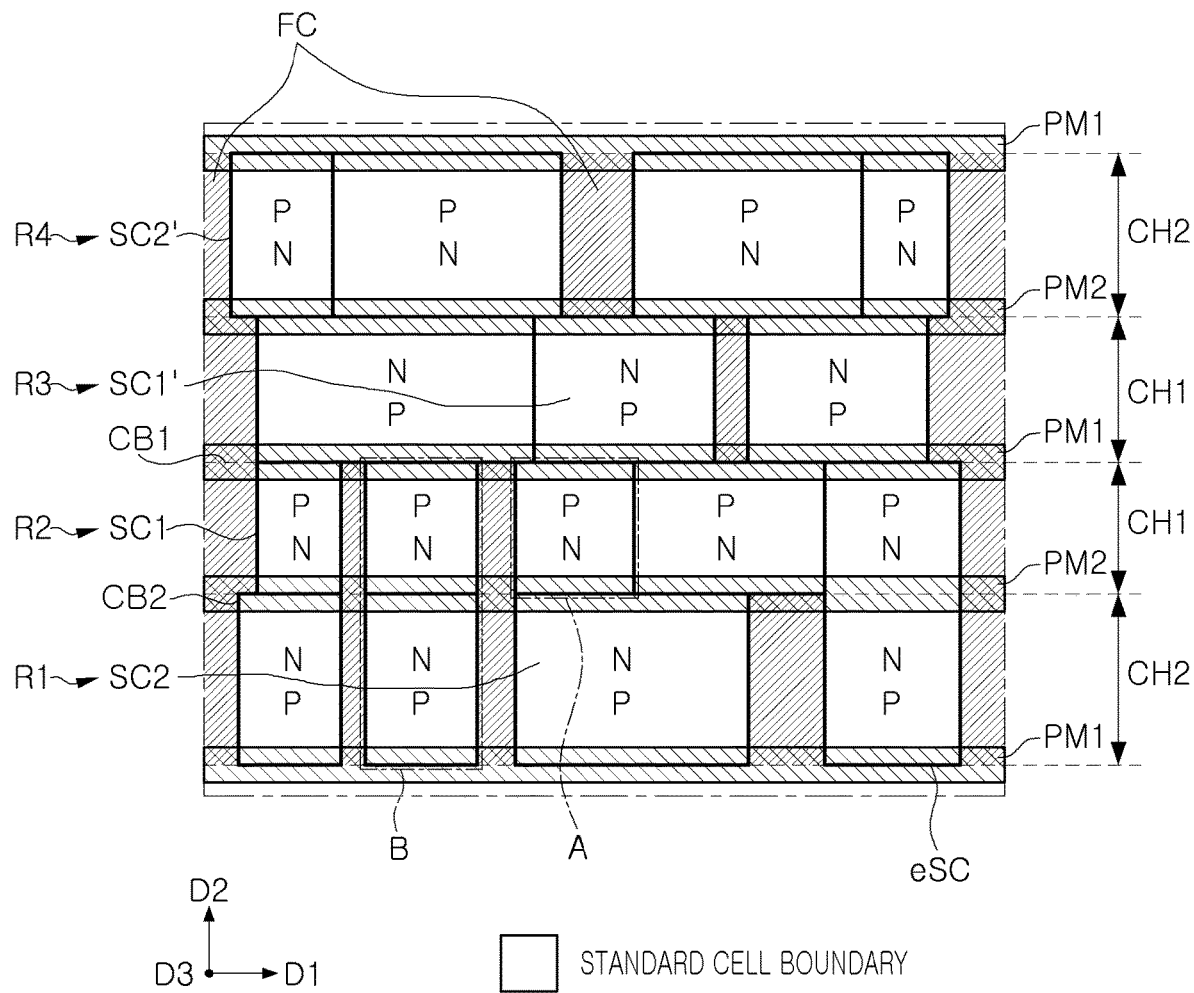
FIG. 2 is a layout diagram of a semiconductor device according to an example embodiment.

FIG. 2 is a schematic plan view of a semiconductor device 300 according to an example embodiment.

Referring to FIG. 2, the semiconductor device 300 may include standard cells SC and filler cells FC. The filler cells FC may fill empty regions of the standard cells SC, and may be provided as dummy regions. Each of the standard cells SC may be disposed in a corresponding row region of the four regions R1 to R4. Each row region may extend lengthwise in a first direction D1, and the row regions R1 to R4 may be arranged in a second direction D2, perpendicular to the first direction D1. In an embodiment, each row region may include a plurality of standard cells SC. For the simplicity of drawings, each of the standard cells SC may be represented using a rectangular with a thick line without showing transistors implemented therein. For example, the first row region R1 has four standard cells including a standard cell SC2. At least one of the four standard cells of the first row region R1 may be a standard cell different from the others thereof. The second row region R2 has five standard cells including a standard cell SC1. At least one of the five standard cells of the second row region R2 may be a standard cell different from the others thereof. The third row region R3 has three standard cells including a standard cell SC1', and at least one of the three standard cells may be a standard cell different from the others. The fourth row region R4 has four standard cells including a standard cell SC2', and at least one of the four standard cells may be a standard cell different from the others. As described with reference to FIG. 1, each row region may be defined by a corresponding row-site formed in the placement step S30 of the design step DSG. Hereinafter, a row may refer to a row region as described above, unless otherwise described. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

A standard cell layout, illustrated in FIG. 2, is a layout designed by the method described with reference to FIG. 1, but may also be understood as a plane of an actual semiconductor device manufactured based on the layout.

Standard cells SC2, SC1, SC1', and SC2' may be arranged in the first to fourth rows R1, R2, R3, and R4, respectively. The standard cells SC1 and SC1' in the second and third rows R2 and R3, respectively, may have a cell height CH1 in the second direction D2, which corresponds to a shorter side of each of the second and third rows R2 and R3. The standard cells SC2 and SC2' in the first and fourth rows R1 and R4, respectively, may have a cell height CH2 in the second direction D2, which corresponds to a shorter side of each of the first and fourth rows R1 and R4. The cell height CH1 of the standard cells SC1 and SC1', disposed in some rows R2 and R3, may be different from the cell height CH2 of the standard cells SC2 and SC2' disposed in other rows R1 and R4.

In the present embodiment, the standard cells SC1 and SC1', respectively arranged in the second and third rows R2 and R3, may have the same first cell height CH1, and the standard cells SC2 and SC2', respectively arranged in first and fourth rows R1 and R4, may have the same second cell height CH2 smaller than the first cell height CH1. At least one of a plurality of standard cells disposed in each row may have a width, in the first direction D1, different from the others. For example, the fourth row R4 has four standard cells including the standard cell SC2' therein. The standard cell SC2' has the same cell height CH2 with the other standard cells in the fourth row S4, and a width different from the other standard cells in the fourth row S4.

Most of the standard cells SC1, SC1', SC2, and SC2' are each arranged in a single row, but at least one of the standard cells may be an extension-type standard cell eSC arranged across two or more adjacent rows R1 and R2. A cell height of such extension-type standard cells eSC may have the sum of heights of adjacent rows. For example, the extension-type standard cells eSC may be disposed in the first and second rows R1 and R2 and may have a cell height corresponding to the sum (CH1+CH2) of the first cell height CH1 and the second cell height CH2.

In the present embodiment, boundaries of the second and third rows R2 and R3 having the first cell height CH1 may extend lengthwise in the first direction D1 and may be spaced apart from each other in a column direction, for example, the second direction D2. Boundaries of the first and fourth rows R1 and R4 having the second cell height CH2 may extend in lengthwise in the first direction D1 and may be spaced apart from each other in the second direction D2. In the present embodiment, the rows have been described as having two cell heights, but rows having three or more different cell heights may be provided and the arrangement thereof may vary. For example, the second and third rows R2 and R3 having the first cell height CH1 and the first and fourth rows R1 and R4 having the second cell height CH2 may be alternately arranged in the second direction D2.

Each of the standard cells SC1, SC1', SC2, and SC2' may have an active region having a first conductivity type (for example, a p-type active region) and an active region having a second conductivity type (for example, an n-type active region) arranged in the column direction, for example, the second direction D2. For the simplicity of drawings, the p-type active region is represented with a character "P", and the n-type active region is represented with a character "N". The standard cells SC1, SC1', SC2, and SC2', disposed in two adjacent rows among the first to fourth rows R1, R2, R3, and R4, may be arranged such that active regions having the same conductivity type are adjacent to each other in the second direction D2. For example, the standard cells SC1 and SC1' of the second and third rows R2 and R3 may be arranged such that p-type active regions are adjacent to each other, and the standard cells SC2 and SC1 of the first and second rows R1 and R2 and the standard cells SC1' and SC2' of the third and fourth rows R3 and R4 may be arranged such that n-type active regions are adjacent to each other in the second direction D2.

A plurality of first and second power supply lines PM1 and PM2, which supply power to the plurality of standard cells SC1, SC2, SC1', and SC2', may each extend lengthwise in the first direction along boundaries of the plurality of standard cells SC1, SC2, SC1', and SC2'. Each of the plurality of first and second power supply lines PM1 and PM2 may supply different voltages to the standard cells SC1, SC2, SC1', and SC2' disposed therebetween. Among the plurality of first and second power supply lines PM1 and PM2, a power supply line, disposed on a boundary between standard cells of two adjacent rows, may a power supply line shared by adjacent standard cells. For example, one of two power supply lines PM2 may extend in the first direction D1 along a boundary between two adjacent rows (e.g., the third row R3 and the fourth row R4), and may partially overlap each of the two adjacent rows, and the other of the two power supply lines PM2 may extend in the first direction D1 along a boundary between two adjacent rows (e.g., the first row R1 and the second row R2), and may partially overlap each of the two adjacent rows.

As illustrated in FIG. 2, the plurality of first power supply lines PM1 may be disposed on a boundary between p-type active regions (for example, between the second row R2 and the third row R3) adjacent to external boundaries (for example, a lower boundary of the first row R1 and an upper boundary of the fourth row R4) adjacent to the p-type active region, and the plurality of second power supply lines PM2 may be arranged on a boundary adjacent to the n-type active region and boundaries between adjacent n-type device regions (for example, boundaries between the first row R1 and the second row R2 and between the third row R3 and the fourth row R4). The first power supply lines PM1 and the second power supply lines PM2 may be alternately arranged in the column direction, for example, the second direction D2.

Figure 3:
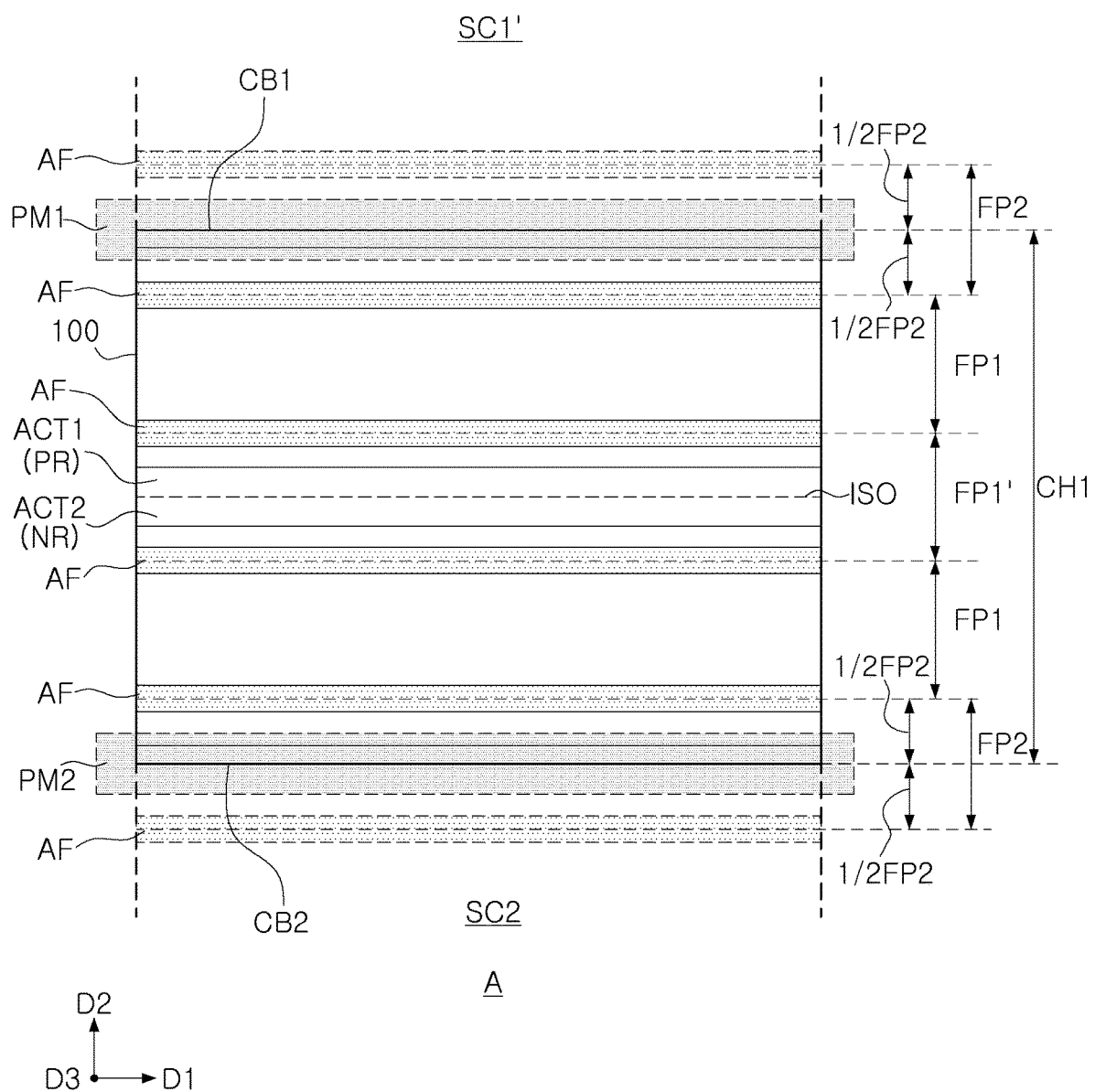
FIG. 3 is a layout diagram of a fin pattern of a standard cell according to an example embodiment.
Figure 4A:
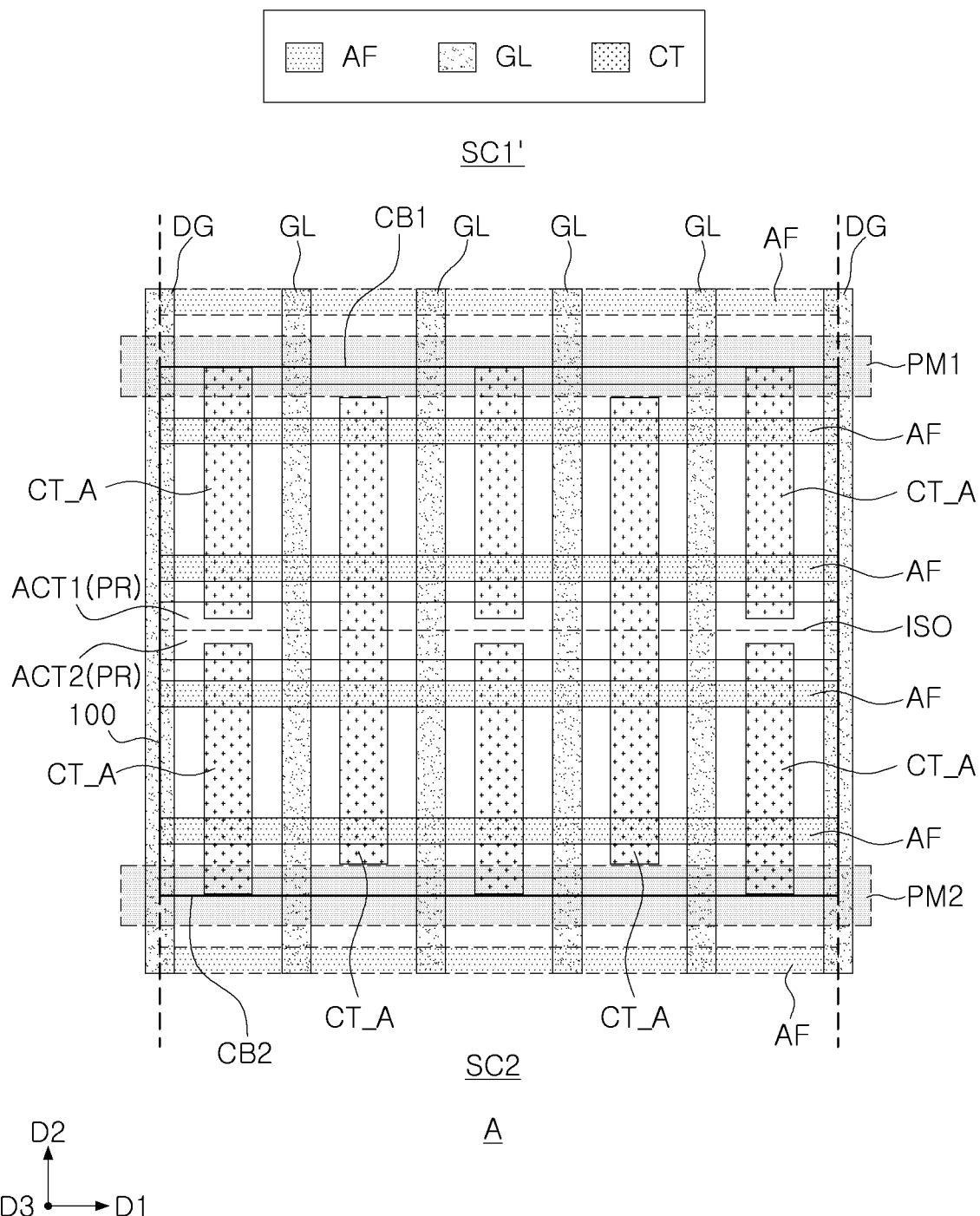
FIGS. 4A and 4B are layout diagrams of an intermediate stage (gate lines and contact structures) and a final stage (interconnection lines) of a standard cell according to an example embodiment, respectively.
Figure 4B:
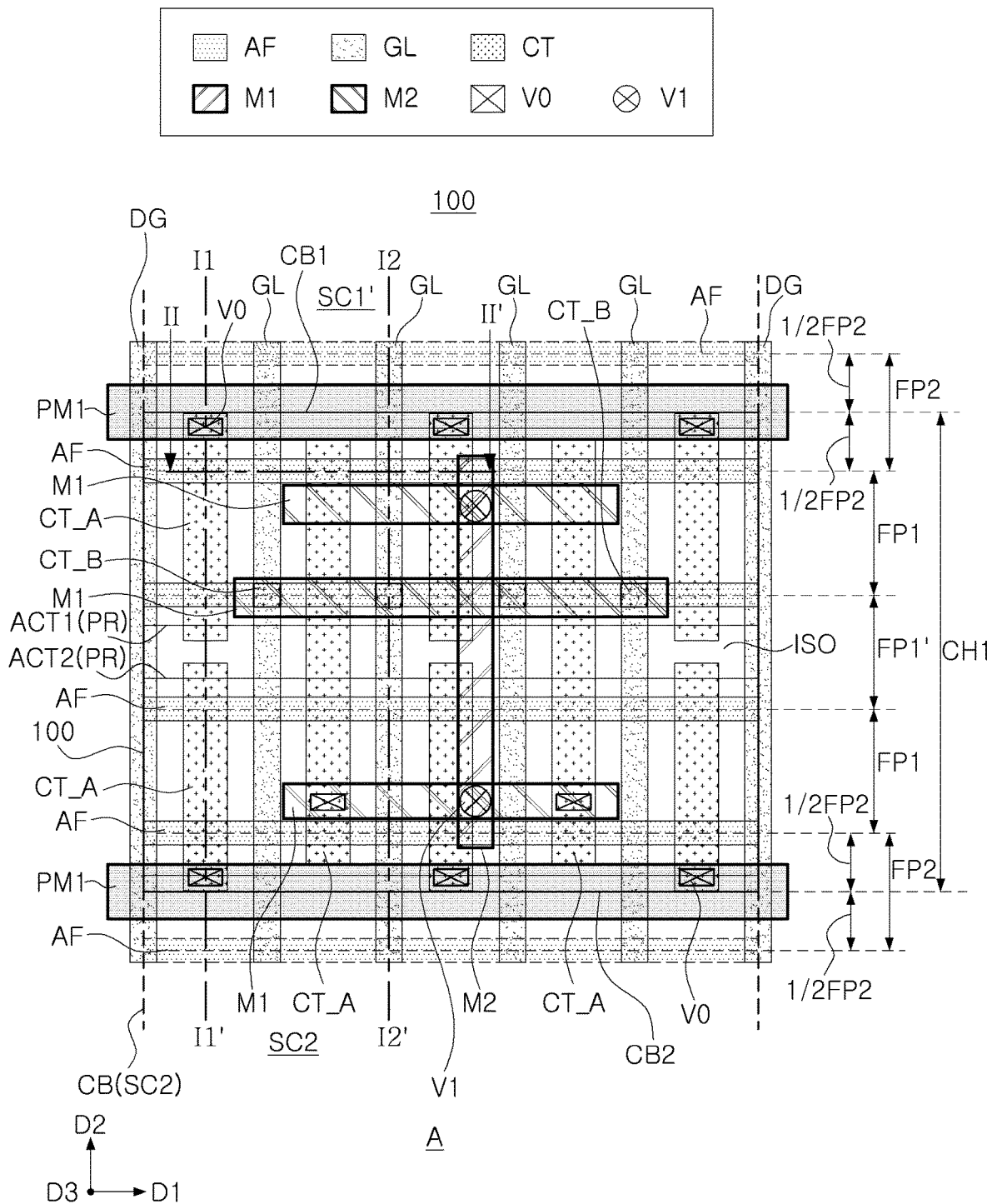

FIG. 3 is a layout diagram of a fin pattern of a standard cell 100 according to an example embodiment. FIGS. 4A and 4B are layout diagrams of an intermediate stage and a final stage of a standard cell 100 according to an example embodiment, respectively.

The standard cell 100 according to the present embodiment may be a unit standard cell indicated by "A" in the layout of FIG. 2, which may also be referred to as a standard cell 100. As illustrated in FIG. 4B, the standard cell 100 may be an inverter element including four p-type transistors and four n-type transistors between a first power supply line PM1, which supplies a first voltage, and a second power supply line PM2, which supplies a second voltage different from the first voltage.

Referring to FIG. 3, the standard cell 100 according to the present embodiment may include first and second active regions ACT1 and ACT2, having different conductivity types, and a plurality of active fins AF protruding from the first and second active regions ACT1 and ACT2 in a third direction D3 and extending in the row direction, for example, the first direction D1.

For example, the first active region ACT1 may be a p-type active region PR provided as a p-type semiconductor substrate or a p-type well, and may be provided as a region for an n-type transistor. The second active region ACT2 may be an n-type active region NR provided as an n-type well, and may be provided as a region for a p-type transistor.

As illustrated in FIG. 3, the plurality of active fins AF may include four active fins, and two active fins AF may be disposed in each of the first and second active regions ACT1 and ACT2. The four active fins AF may be disposed to be spaced apart from each other in the second direction D2.

Standard cells SC1' and SC2 of different rows (R3 and R1 of FIG. 2) may be disposed to be adjacent to each other on two boundaries CB1 and CB2 of the standard cell 100. The two boundaries CB1 and CB2 may extend lengthwise in the first direction D1 and may be spaced apart from each other in the second direction D2. For example, the standard cell 100 according to the present embodiment may have a first boundary CB1 with the standard cell SC1' of the third row R3 and a second boundary CB2 with the standard cell SC2 of the first row R1.

The four active fins AF may be arranged to be spaced apart from each other in the second direction D2 so as not to be disposed on the first and second boundaries CB1 and CB2. The four active fins AF may be disposed between the first and second boundaries CB1 and CB2, without overlapping the first and second boundaries CB1 and CB2. As illustrated in FIG. 3, two active fins AF disposed in the first and second active regions ACT1 and ACT2 may be arranged at a first pitch FP1, and active fins AF adjacent to an isolation region ISO may be arranged at a third pitch FP1' different from the first pitch FP1.

Active fins AF adjacent to the first and second boundaries CB1 and CB2 may be arranged at a second pitch FP2 with adjacent active fins AF of other neighboring standard cell SC2 and SC1'. In the standard cell 100, the active fins AF adjacent to the first and second boundaries CB1 and CB2 may be spaced apart from the first and second boundaries CB1 and CB2, respectively. In the present embodiment, among the active fins AF of other neighboring standard cells SC2 and SC1', a pair of active fins AF adjacent to the first boundary CB1 may be arranged at the same pitch (or distance) ½FP2 with the first boundary CB1. Similarly, a pair of active fins AF adjacent to the second boundary CB2 may also be arranged at the same pitch (or distance) ½FP2 with the second boundary CB2. The cell height CH1 of the standard cell 100, employed in the present embodiment, may be defined as FP1'+2FP1+FP2.

In the present embodiment, the standard cell 100 may include only active fins AF of transistors, without including a dummy fin. A dummy fin may be omitted to implement a unit circuit for the same function in a standard cell having a relatively small cell height and to further diversify a cell library. The term "dummy fin" refers to a structure derived from a fin structure protruding from an active region, similarly to the active fin, but not being a part of a transistor in a final semiconductor device. The final semiconductor device may not include any transistor formed with using the dummy fin (e.g., may not include any transistor having a channel region formed from a portion of the dummy fin). Such dummy fins may have various shapes and structures (see FIGS. 10A and 10B).

In the present embodiment, the plurality of active fins AF may include four active fins, and the same number of active fins AF (for example, two active fins AF) may be disposed in each of the first and second active regions ACT1 and ACT2. However, different numbers of active fins AF (one or three or more active fins AF) may be disposed in the first and second active regions ACT1 and ACT2. Accordingly, the first and second active regions ACT1 and ACT2 may also have different areas (for example, heights defined in the second direction D2). In some embodiments, the pitch of the active fins AF may also be implemented under other conditions, as set forth in embodiments to be described later.

FIGS. 4A and 4B illustrate layouts of an intermediate stage and a final stage of the standard cell 100, for example, a standard cell 100 implemented based on the layout of the fin pattern illustrated in FIG. 3, respectively.

Referring to FIG. 4A, a standard cell 100 may include six gate lines GL and DL extending in a column direction, for example, a second direction D2 to intersect four active fins AF. The gate lines GL and DL may be arranged in a first direction D1 at a constant pitch.

In the present embodiment, two gate lines passing through first and second boundaries CB1 and CB2 facing each other in the first direction D1 of the standard cell 100 may be provided as a dummy gate structure DL. Four gate lines, disposed between the dummy gate structures DL, may be provided as gate structures GL constituting a transistor.

First contact structures CT_A may be disposed on the active fins AF and may be disposed on opposite sides of each of four gate structures GL. In the present embodiment, the first contact structures CT_A may extend lengthwise in the second direction D2 and may overlap at least two active fins AF disposed in the first and second active regions ACT1 and ACT2. The first contact structures CT_A may be provided as a source/drain contact. Some of the first contact structures CT_A may extend to the first and second boundaries CB1 and CB2, facing each other in the second direction D2. Some of the first contact structures CT_A may be connected to the first power supply line PM1, and some of the first contact structures CT_A may be connected to the second power supply line PM2. (see FIG. 5A).

Referring to FIG. 4B, the standard cell 100 may include second contact structures CT_B for a gate contact, first and second interconnection lines M1 and M2, and first and second power supply lines PM1 and PM2 which are added on the layout illustrated in FIG. 4A.

The first and second power supply lines PM1 and PM2 may be disposed on the boundaries CB1 and CB2 facing each other in the second direction D2 of the standard cell 100. In an embodiment, the first boundary CB1 may be disposed between the standard cell 100 and a standard cell SC1', and the first power supply line PM1 may partially overlap each of the standard cell 100 and the standard cell SC1'. In an embodiment, the second boundary CB1 may be disposed between the standard cell 100 and a standard cell SC2, and the second power supply line PM2 may partially overlap each of the standard cell 100 and the standard cell SC2. Three first interconnection lines M1, extending in the first direction D1, may be arranged between the first and second power supply lines PM1 and PM2. The first and second power supply lines PM1 and PM2 and the three first interconnection lines M1 may be arranged at a constant pitch in the second direction D2. However, some interconnection lines may be omitted. In this case, two interconnection lines adjacent to an omitted region may be arranged at a pitch two times the constant pitch. In the present embodiment, it will be understood that a single interconnection line is omitted between a lowermost first interconnection line and a next lowermost interconnection line, among the first interconnection lines M1.

Each of the first and second power supply lines PM1 and PM2 may be connected to a portion of the first contact structures CT_A by first vias V0 (see FIG. 5A), and each of the two first interconnection lines M1, respectively adjacent to the PM1 and PM2, may be connected to another portions of the first contact structures CT_A by the first vias V0. The first interconnection line M1, disposed between the adjacent two first interconnection lines M1, may be connected to four gate structures GL by second contact structures CT_B, respectively provided as gate contacts (see FIG. 5B).

A second interconnection line M2 may be disposed on the first interconnection lines M1. In the present embodiment, the second interconnection line M2 may extend in the second direction D2. The second interconnection line M2 may be connected to two first interconnection lines M1, respectively adjacent to the first and second power supply lines PM1 and PM2, by second vias V1.

As described above, the standard cell 100 according to the present embodiment may be provided as an inverter element including four p-type transistors and four n-type transistors disposed between the first and second power supply lines PM1 and PM2.

Figure 5A:
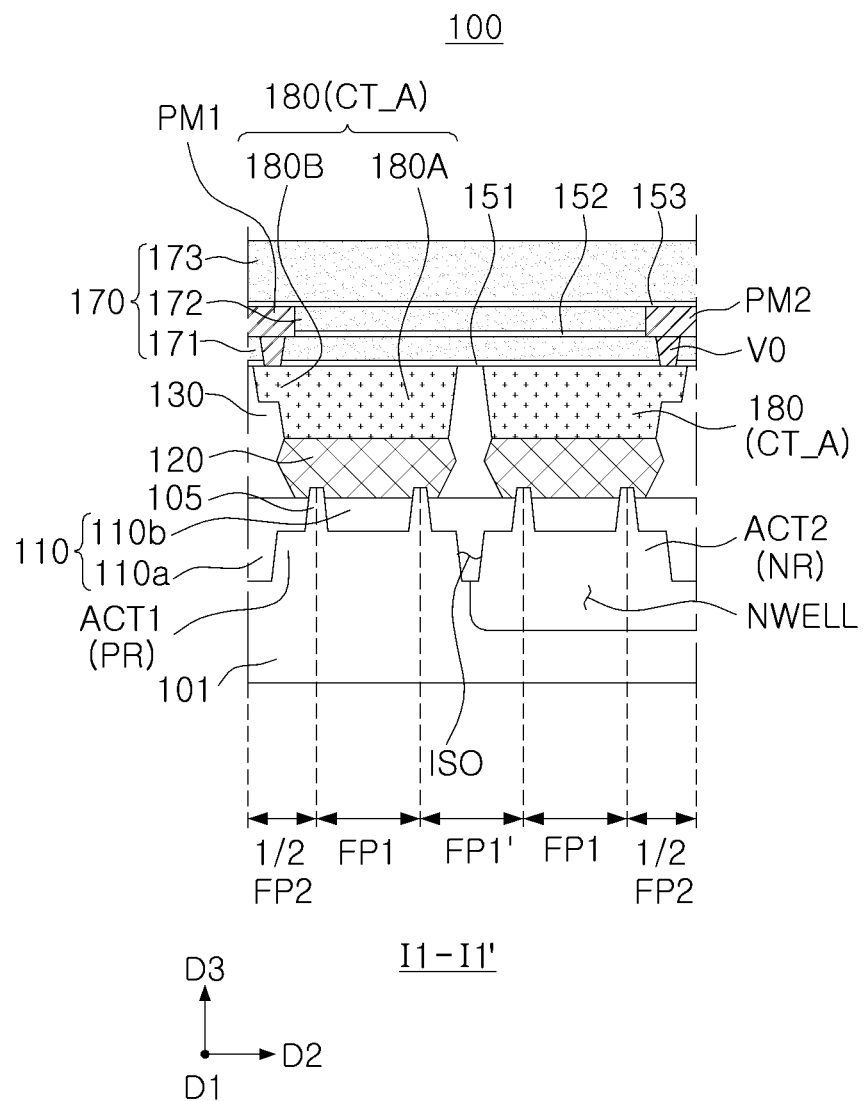
FIGS. 5A to 5C are cross-sectional views of the standard cell of FIG. 4, taken along lines I1-I1', I2-I2', and II-II' of FIG. 4, respectively.
Figure 5B:
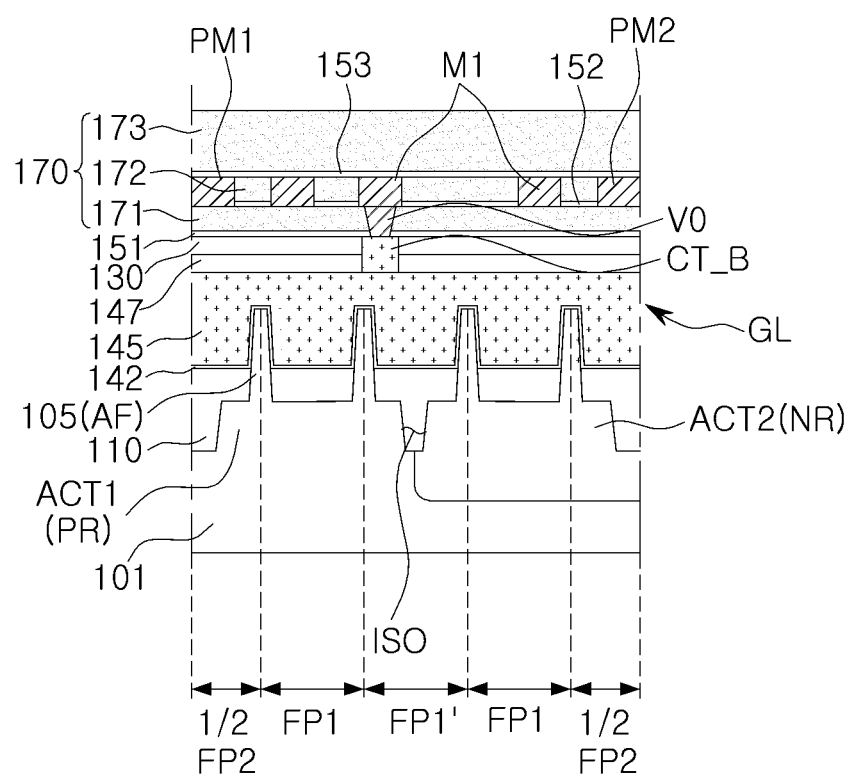
Figure 5C:
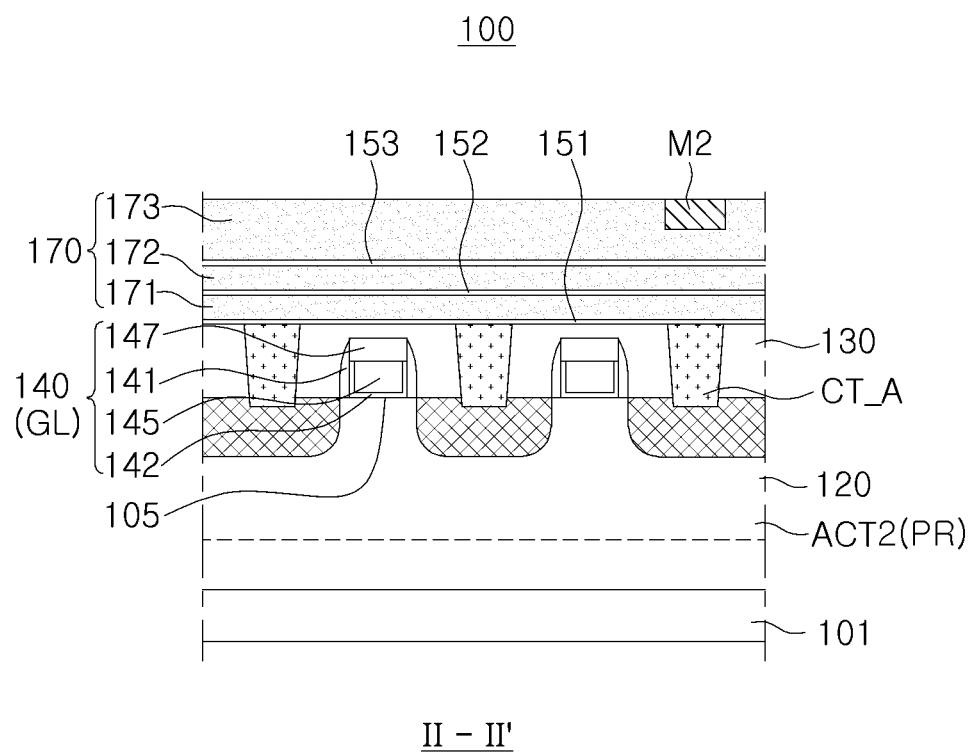

FIGS. 5A to 5C are cross-sectional views of the standard cell of FIG. 4, taken along lines I1-I1', I2-I2', and II-II' of FIG. 4, respectively.

Referring to FIGS. 5A to 5C, a standard cell 100 according to the present embodiment may include a substrate 101, active regions 102 having active fins 105 or AF, an isolation layer 110, and source/drain regions 120, gate structures 140 each having a gate electrode 145, a lower interlayer insulating layer 130, a contact structure 180, for example, CT_A or CT_B, an upper interlayer insulating layer 170, and first and second interconnection lines M1 and M2. The standard cell 100 may include Fin-type field effect transistor (FinFET) devices in which channels are formed in an active fin. The present invention is not limited thereto. In an embodiment, the standard cell 100 may include nanosheets (for example, MBCFET®) as channels.

As described above, in the present embodiment, active fins AF are not disposed on first and second boundaries CB1 and CB2 on which the first and second power supply lines PM1 and PM2 are disposed, and dummy fins, not constituting a transistor, are not present, as illustrated in FIGS. 5A and 5B.

The substrate 101 may have an upper surface extending in a first direction D1 and a second direction D2. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 has a first active region ACT1, and a second active region ACT2 may be provided by a doped region such as an N-well NWELL.

The isolation layer 110 may define active regions 102 in the substrate 101. The isolation layer 110 may be formed by, for example, a shallow trench isolation (STI) process. As illustrated in FIG. 5A, the isolation layer 110 may include a region 110a extending deeper downwardly of the substrate 101 between the first and second active regions ACT1 and ACT2, and a region 110b surrounding lower portions of the active fins 105. In an embodiment, the region 110a of the isolation layer 110 may define the first and second active regions ACT1 and ACT2. The present inventive concept is not limited thereto. In some embodiments, the isolation layer 110 may have a curved upper surface having a level increased in a direction toward the active fins 105. The isolation layer 110 may be formed of an insulating material such as an oxide, a nitride, or a combination thereof.

The active regions 102 may be defined by the isolation layer 110 in the substrate 101, and may extend in the first direction D1. The active fins 105 may have a structure protruding from the substrate 101 in a third direction D3. Upper ends of the active fins 105 may be disposed to protrude from an upper surface of the isolation layer 110 to a predetermined height. The active fins 105 may be formed as a portion of the substrate 101. The present inventive concept is not limited thereto. In an embodiment, the active fins 105 may be an epitaxial layer grown from the substrate 101. A portion of the active fins 105 may be recessed on opposite sides adjacent to the gate structures GL, and source/drain regions 120 may be disposed on the recessed active fins 105. In some embodiments, the active regions ACT may have doped regions including impurities. For example, the active fins 105 may include impurities diffused from the source/drain regions 120 in a region in contact with the source/drain regions 120. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The source/drain regions 120 may be disposed on regions, in which the active fins 105 are recessed, on opposite sides adjacent to the gate structures GS. In the present embodiment, the source/drain regions 120 may have an upper surface on a higher level than an upper surface of the active fin 105. To form the source/drain regions 120, a recess may be formed in a certain region of the active fin 105, and then selective epitaxial growth (SEG) may be performed on the recess, thereby forming the source/drain regions 120. The source/drain regions 120 may be provided as a source region or a drain region of transistors. Upper surfaces of the source/drain regions 120 may be disposed on the same or similar height level as a lower surface of the gate structure GL, when viewed from the cross section illustrated in FIG. 5C. In another embodiment, a relative height of the source/drain regions 120 and the gate structure GL may vary.

The source/drain regions 120 may have a merged shape in which they are connected to each other between adjacent active fins 105 in a second direction D2, as illustrated in FIG. 5A, but the present disclosure is not limited thereto. The source/drain regions 120 may have angular side surfaces, when viewed from the cross section illustrated in FIG. 5A. However, in example embodiments, the source/drain regions 120 may have various shapes, and may have one of, for example, polygonal, circular, elliptical, and rectangular shapes.

The source/drain regions 120 may be formed of an epitaxial layer and may include, for example, silicon (Si), silicon germanium (SiGe), or silicon carbide (SiC). The source/drain regions 120 may further include impurities such as arsenic (As) and/or phosphorus (P). In some embodiments, the source/drain regions 120 may include a plurality of regions including elements and/or doping elements having different concentrations.

The gate structure GL may intersect the active fins 105 to extend in the second direction D2. Channel regions of transistors may be formed in the active fins 105 intersecting the gate structure GS. The gate structure GL may include gate spacers 141, a gate insulating layer 142, a gate electrode 145, and a gate capping layer 147.

The gate insulating layer 142 may be disposed between the active fin 105 and the gate electrode 145. In some embodiments, the gate insulating layer 142 may include a plurality of layers or may be disposed to extend upwardly along a side surface of the gate electrode 145. The gate insulating layer 142 may include an oxide, a nitride, or a high-k dielectric material. The high-k dielectric material may be a dielectric material having a higher dielectric constant than a silicon oxide film ($SiO_2$).

The gate electrode 145 may include a conductive material, for example, a metal nitride such as titanium nitride (TiN), tantalum nitride (TaN), or tungsten nitride film (WN), and/or a metal material such as aluminum (Al), tungsten (W), molybdenum (Mo), or a semiconductor material such as doped polysilicon. The gate electrode 145 may have a multilayer structure including two or more layers. The gate electrode 145 may be disposed to be separated from each other, in the second direction D2, between at least some adjacent transistors, depending on a circuit layout of the standard cell 100. For example, a gate-cut may be additionally formed in the gate electrode 145 to divide the gate electrode 145 into a plurality of gate electrodes.

The gate spacers 141 may be disposed on opposite side surfaces of the gate electrode 145. The gate spacers 141 may insulate the source/drain regions 120 from the gate electrode 145. In some embodiments, the gate spacer layers 146 may have a multilayer structure. The gate spacers 141 may include an oxide, or a low dielectric material such a nitride and an oxynitride. For example, the gate spacers 141 may include at least one of $SiO_2$, SiN, SiCN, SiOC, SiON, and SiOCN.

The gate capping layer 147 may be disposed on the gate electrode 145, and a lower surface and side surfaces of the gate capping layer 147 may be surrounded by the gate electrode 145 and the gate spacers 141, respectively. For example, the gate capping layer 147 may include an oxide, a nitride, and an oxynitride.

The lower interlayer insulating layer 130 may be disposed to cover the source/drain regions 120 and the gate structure GL. The lower interlayer insulating layer 130 may include, for example, at least one of an oxide, a nitride, and an oxynitride, and may include a low dielectric material.

The contact structure 180 may include a first contact structure CT_A, connected to the source/drain regions 120 through the lower interlayer insulating layer 130, and a second contact structure CT_B connected to the gate electrode 145 through the gate capping layer 147 and the lower interlayer insulating layer 130. The first contact structure CT_A may have a lower end buried in the source/drain regions 120 to a predetermined depth as shown in FIG. 5C, but the present inventive concept is not limited thereto.

The contact structure 180 may include a conductive barrier 182 and a contact plug 185. For example, the contact plug 185 may include a metal material such as tungsten (W), aluminum (Al), copper (Cu), or a semiconductor material such as doped polysilicon. In some embodiments, the contact structure 180 may further include a metal-semiconductor layer such as a silicide layer disposed on an interface between the contact structure 180 and the source/drain regions 120, and between the contact structure 180 and the gate electrode 145.

The upper interlayer insulating layer 170 may cover the contact structures 180 and may include first to third dielectric layers 171, 172, and 172. First and second interconnection lines M1 and M2 may be disposed between the first to third dielectric layers 171, 172, and 172. A first via V0 may penetrate through the first dielectric layer 171 to connect the contact structure 180 and the first interconnection lines M1 to each other, and a second via V1 may penetrate through the second dielectric layer 172 to connect the first interconnection lines M1 and the second interconnection line M2 to each other. For example, the first to third dielectric layers 171, 172, and 172 may include at least one of SiO, SiN, SiCN, SiOC, SiON, and SiOCN. The first and second interconnection lines M1 and M2 and the first and second vias V0 and V1 may each include at least one of aluminum (Al), copper (Cu), and tungsten (W).

The etch-stop layers 151, 152, and 153 may be disposed on lower surfaces of the first to third dielectric layers 171, 172, and 173, respectively. The etch-stop layers 151, 152, and 153 may be used as etch-stop elements in an etching process for forming the first via V0, the first interconnection lines M1, the second via V1, and the second interconnection line M2. The etch-stop layers 151, 152, and 153 may include a high-k dielectric material, for example, a silicon nitride or an aluminum oxide.

Such fin patterns including active fins and/or dummy fins may be formed through a photolithography process, a double patterning technology (DPT) process, a quadruple patterning technology (QPT) process, an extreme ultraviolet (EUV) process, or the like.

The fin patterns, which may be employed in the present embodiment, may be modified in various forms. For example, a standard cell according to the present embodiment may include at least one dummy fin. In some embodiments (for example, FIGS. 6 and 7A), at least one dummy fin may be disposed on one of the first and second boundaries. In some embodiments (for example, FIGS. 7A and 8A), at least one dummy fin may include a pair of dummy fins arranged adjacent to each other with at least one of the first and second boundaries interposed therebetween.

In some embodiments (for example, FIGS. 6 and 7A), fin patterns disposed in a first active region and a second active region of standard cells may be asymmetrically arranged. For example, even in a single standard cell, the number of active fins and/or dummy fins, a pitch of fin patterns, and a distance between a boundary and a fin pattern adjacent to the boundary may be different from each other.

Figure 6:
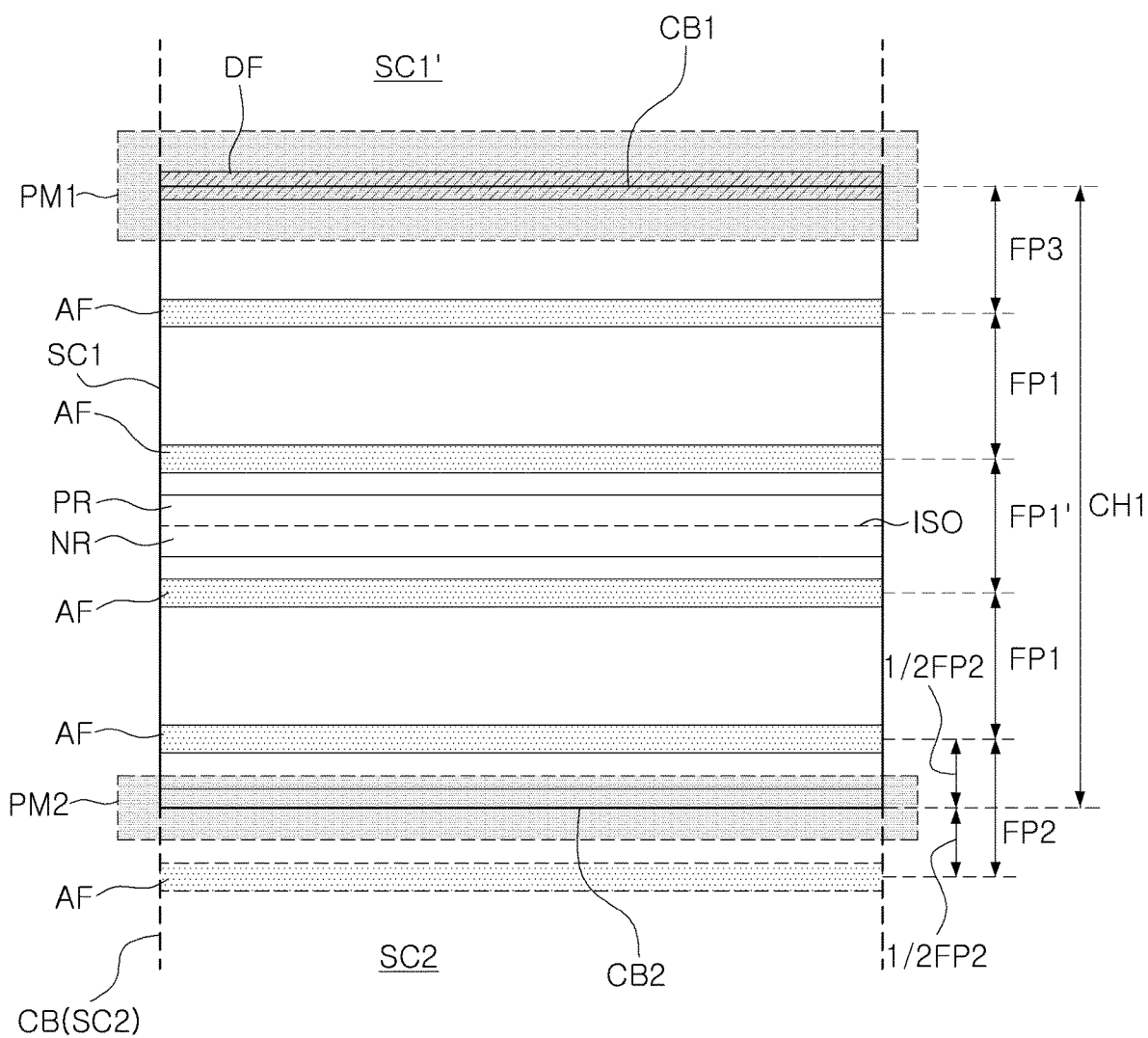
FIG. 6 is a layout diagram of fin patterns of a standard cell according to an example embodiment.

FIG. 6 is a layout diagram of fin patterns of a standard cell according to an example embodiment.

Referring to FIG. 6, a standard cell 100A according to the present embodiment may be understood be similar to the standard cell 100, illustrated in FIGS. 2 to 5C, except that a dummy fin DF is disposed on one boundary of the standard cell 100A. Components of the present embodiment may be understood with reference to the descriptions of the same or similar components of the standard cell 100 illustrated in FIGS. 2 to 5C, unless otherwise specified.

The standard cell 100A according to the present embodiment may include first and second boundaries CB1 and CB2, respectively adjacent to standard cells SC1' and SC2 of other adjacent rows (R3 and R1 in FIG. 2). A dummy fin DF of the standard cell 100A may be arranged to be disposed on the first boundary CB1, but no dummy fin is disposed on the second boundary CB2. The first boundary CB1 may be disposed between the standard cell 100A, which is disposed in the second row R2 (see, FIG. 2), and a standard cell SC1', which is disposed in the third row R3 which is adjacent to the second row R2, and the dummy fin DF may partially overlap each of the standard cell 100A (or the second row R2) and the standard cell SC1' (or the third row R3). The second boundary CB2 may be disposed between the standard cell 100A, which is disposed in the second row R2, and a standard cell SC2, which is disposed in the first row R1. Similarly to the previous embodiment (see FIG. 3), no active fin AF and no dummy fin DF may be disposed on the second boundary CB2.

As illustrated in FIG. 6, two active fins AF, respectively disposed in the first and second active regions PR and NR, may be arranged at a first pitch FP1, and active fins AF adjacent to an isolation region ISO may be arranged at a pitch FP1' different from the first pitch FP1.

Active fins AF adjacent to the first and second boundaries CB1 and CB2 within the standard cell 100A may be asymmetrically spaced from the first and second boundaries CB1 and CB2, respectively. In the present embodiment, the active fins AF adjacent to the first boundary CB1 may be arranged at a third pitch FP3 with a dummy fin DF disposed on the first boundary CB1. Similarly to the previous embodiment, an active fin AF of another standard cell SC2 neighboring the active fin AF adjacent to the second boundary CB2 may be arranged at the same pitch ½FP2 as the second boundary CB2.

As described above, a cell height of the standard cell 100A, employed in the present embodiment, may be defined as FP1'+2FP1+½FP2+FP3, and the fin patterns AF and DF disposed in the first active region PR and the second active region NR of the standard cells according to the present embodiment may be disposed asymmetrically arranged with respect to each other. For example, active fins AF adjacent to the first and second boundaries CB1 and CB2 within the standard cell 100A may be spaced apart from the first and second boundaries CB1 and CB2 at different pitches FP3 and ½FP2 (or different distances).

Figure 7A:
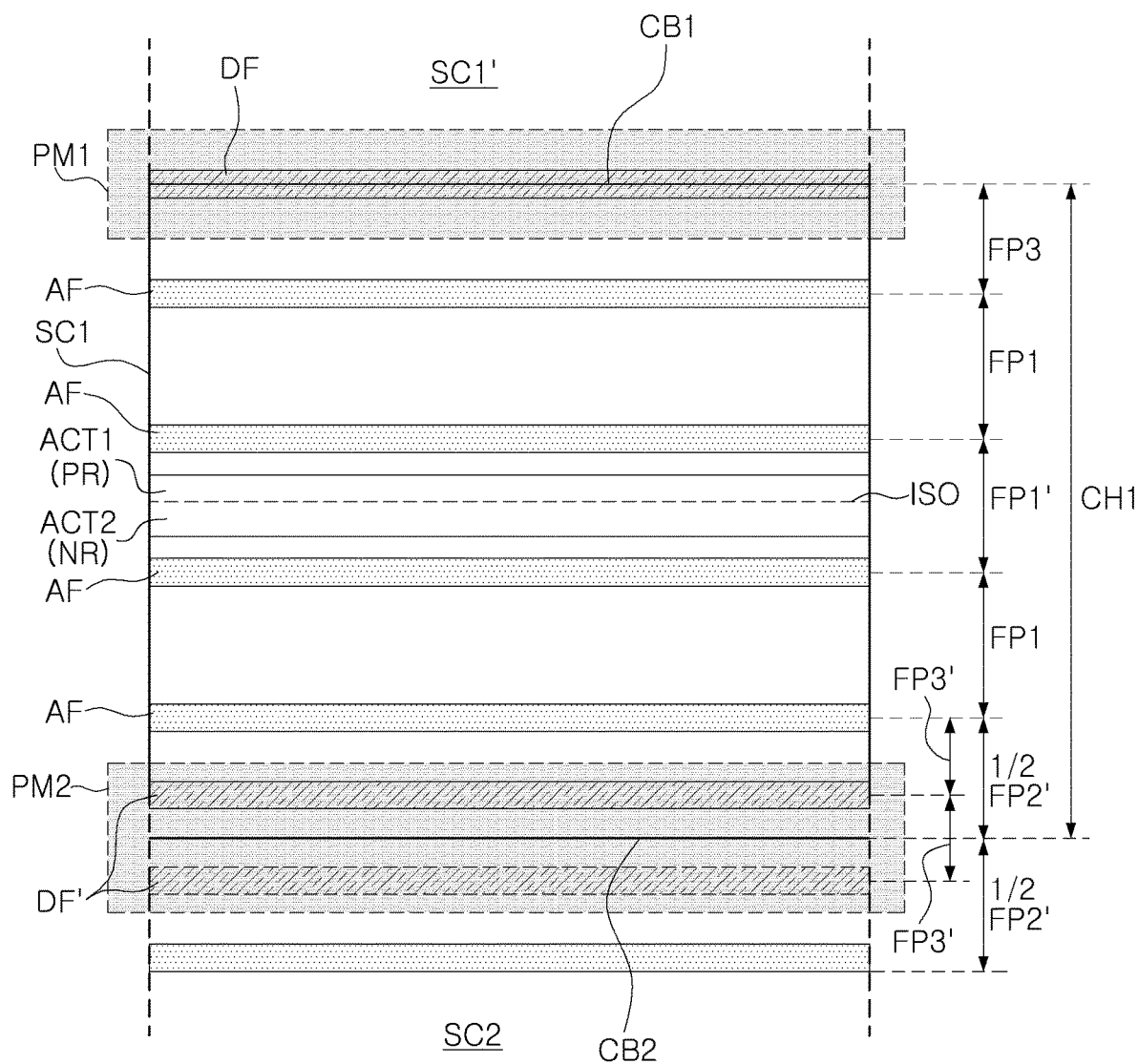
FIGS. 7A and 7B are layout diagrams of fin patterns of a standard cell and a final standard cell according to an example embodiment, respectively.
Figure 7B:
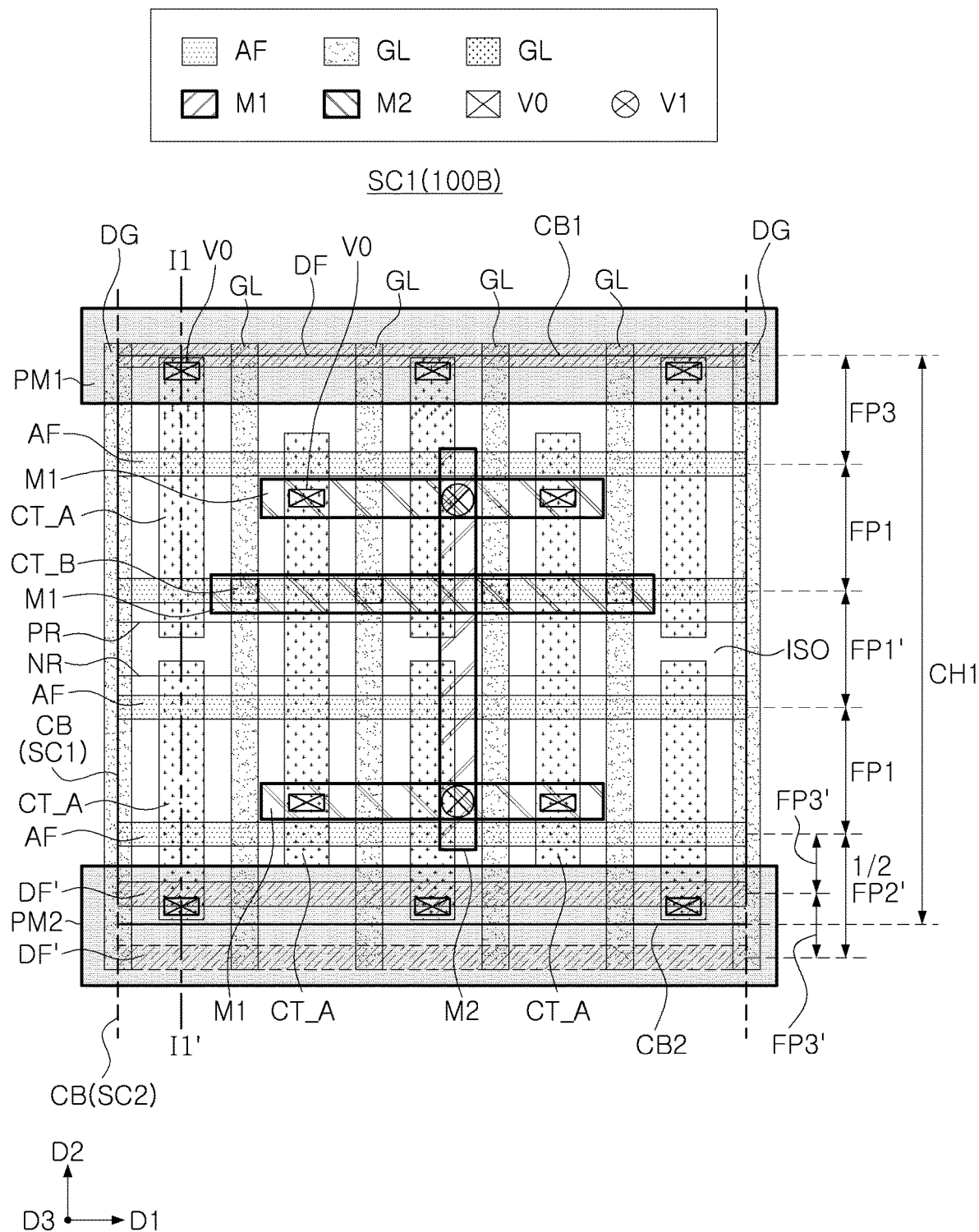

FIGS. 7A and 7B are layout diagrams of fin patterns of a standard cell and a final standard cell according to an example embodiment, respectively.

Referring to FIGS. 7A and 7B, a standard cell 100B according to the present embodiment will be understood to be similar to the standard cell 100, described with reference to FIGS. 2 to 5C, except that a dummy fin DF is disposed on one side boundary and a pair of fin patterns adjacent to the other side boundary are dummy fins DF'. Components of the present embodiment may be understood with reference to the descriptions of the same or similar components of the standard cell 100 illustrated in FIGS. 2 to 5C, unless otherwise specified.

As illustrated in FIG. 7A, similarly to the standard cell 100A illustrated in FIG. 6, a standard cell 100B according to the present embodiment may include fin patterns adjacent to a first boundary CB1 without overlapping a second boundary CB2. However, unlike the previous embodiment, fin patterns adjacent to the second boundary CB2 may be a pair of dummy fins DF'. The pair of dummy fins DF' may be arranged at a constant pitch FP3', and may be arranged at a constant distance (for example, ½FP3') with the second boundary CB2 interposed therebetween. For example, the second boundary CB2 is disposed between the pair of dummy fins DF'. A first dummy fin of the pair of dummy fins DF' is disposed in the standard cell 100, and the other is disposed in a standard cell SC2 adjacent to the standard cell 100. The first dummy fin is spaced apart, in the second direction D2, from the second boundary CB2 at a distance of ½FP3'. The first dummy fin is spaced apart, in the second direction D2 at a pitch FP3', from an active fin AF which is closest to the second boundary CB2 among the four active fins AF disposed in the standard cell 100B.

Similarly to the previous embodiment, two active fins AF, respectively disposed in first and second active regions PR and NR, may be arranged at a first pitch FP1, and active fins AF adjacent to an isolation region ISO may be arranged at a pitch FP1' different from the first pitch FP1.

Similarly to the standard cell 100A, active fins AF adjacent to the first and second boundaries CB1 and CB2 within the standard cell 100B may be asymmetrically spaced apart from the first and second boundaries CB1 and CB2, respectively. For example, an active fin AF which is closest to the second boundary CB2 among the four active fins AF is spaced apart, in the second direction D2, from the second boundary CB2 at a distance of ½FP2', and an active fin AF which is closest to the first boundary CB1 among the four active fins AF is spaced apart, in the second direction D2, from the first boundary CB1 at a distance of FP3 which is different from the pitch ½FP2'.

As described above, a cell height CH1 of the standard cell 100B may be defined as FP1'+2FP1+½FP2'+FP3, and the active fins AF adjacent to the first and second boundaries CB1 and CB2 within the standard cell 100B may be spaced apart from the first and second boundaries CB1 and CB2 at different distances FP3 and ½FP2', respectively.

The layout, illustrated in FIG. 7B, the standard cell 100B may include gate lines GL and DL, first and second contact structure CT_A and CT_B, first and second interconnection lines M1 and M2, and first and second power supply lines PM1 and PM2 which are added on the pattern layout illustrated in FIG. 7A. A unit circuit, implemented in the standard cell 100B of FIG. 7B, may be an inverter element including four p-type transistors and four n-type transistors disposed between the first and second power supply lines PM1 and PM2 to perform the same function as the layout of the standard cell illustrated in FIG. 4B. Each of the components of the present embodiment and connection relationships thereof will be understood with reference to what was described in FIGS. 4A and 4B.

Figure 8:
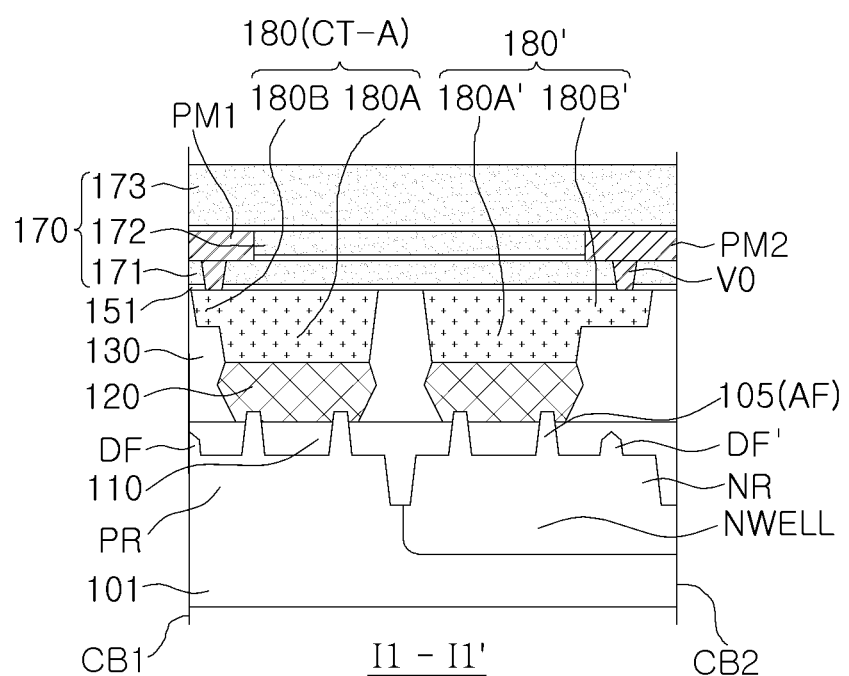
FIG. 8 is a cross-sectional view of the standard cell FIG. 7B, taken along line I1-I1' of FIG. 7B.
Figure 8:
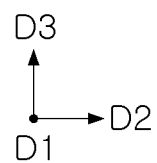

FIG. 8 is a cross-sectional view of the standard cell FIG. 7B, taken along line I1-I1' of FIG. 7B.

Referring to FIG. 8, similarly to the standard cell 100 illustrated in FIGS. 3A to 3C, the standard cell 100B according to the present embodiment may include a substrate 101, active region having active fins 105 or AF, an isolation layer 110, source/drain regions 120, gate structures 140 each having a gate electrode 145, a lower interlayer insulating layer 130, a contact structure 180, for example, CT_A or CT_B, an upper interlayer insulating layer 170, and first and second interconnection lines M1 and M2.

The standard cell 100B according to the present embodiment may include two dummy fins DF and DF', respectively disposed in first and second active regions ACT1 and ACT2. The dummy fin DF in the first active region ACT1 may be disposed on the first boundary CB1, and the dummy fin DF' in of the second active region ACT2 may be disposed adjacent to the second boundary CB2. Unlike the standard cell 100 illustrated in FIG. 3A, the fin patterns AF, DF, and DF' of the standard cell 100B may be asymmetrically arranged in the first and second active regions ACT1 and ACT2.

As illustrated in FIG. 8, a distance between the second boundary CB2 and an active fin AF adjacent to the second boundary CB2 may be greater than a distance between the first boundary CB1 and an active fin AF adjacent to the first boundary CB1. Accordingly, an extension portion 180B' of a first contact structure 180', connected to the second power supply line PM2, may extend longer an extension portion 180B of a first contact structure 180 in a second direction D2. The extension portion 180B' may be a portion extended, in the second direction D2, from a contact portion 180A' which contacts a first source/drain region 120 (i.e., the right one of the two source/drain regions 120). The extension portion 180B may be a portion extended, in the second direction D2, from a contact portion 180A which contact a second source/drain region 120 (i.e., the left one of the two source/drain regions 120).

In some embodiments, when a fin pattern such as an active fin is formed, a dummy fin has the same or similar structure formed by the same process as the active fin, but may be an element having at least a portion removed through an additional process such as a fin-cut process (for example, a selective etching process) so as so as not to serve as a portion of the semiconductor device. Similarly to an active fin, such a dummy fin may remain in standard cells in a row direction (for example, a first direction D1) in various forms.

Figure 9A:
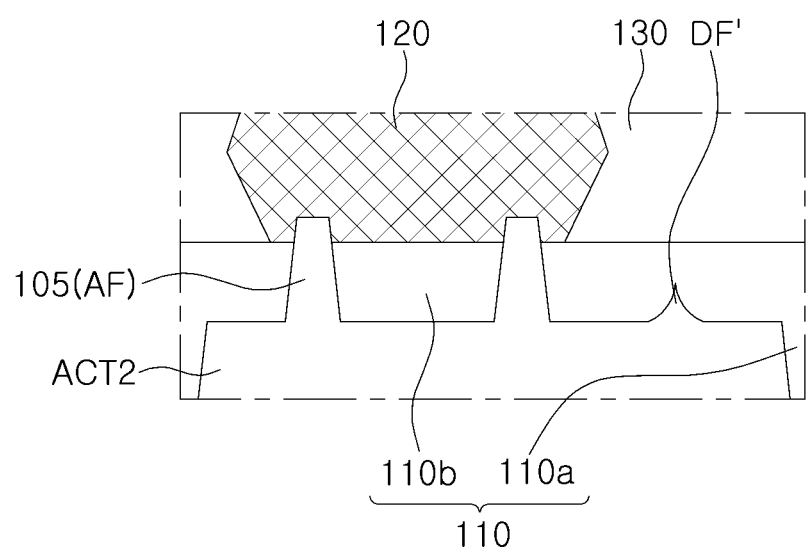
FIGS. 9A to 9C are enlarged cross-sectional views illustrating various examples related to a dummy fin.
Figure 9B:
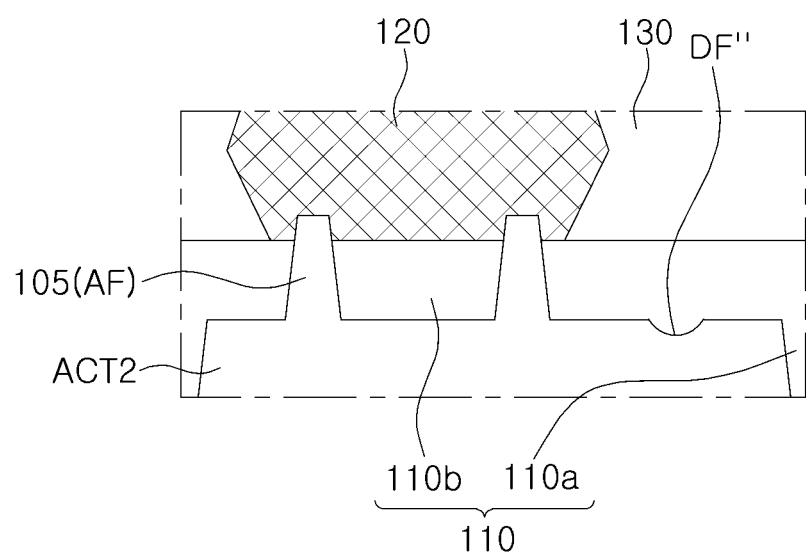
Figure 9C:
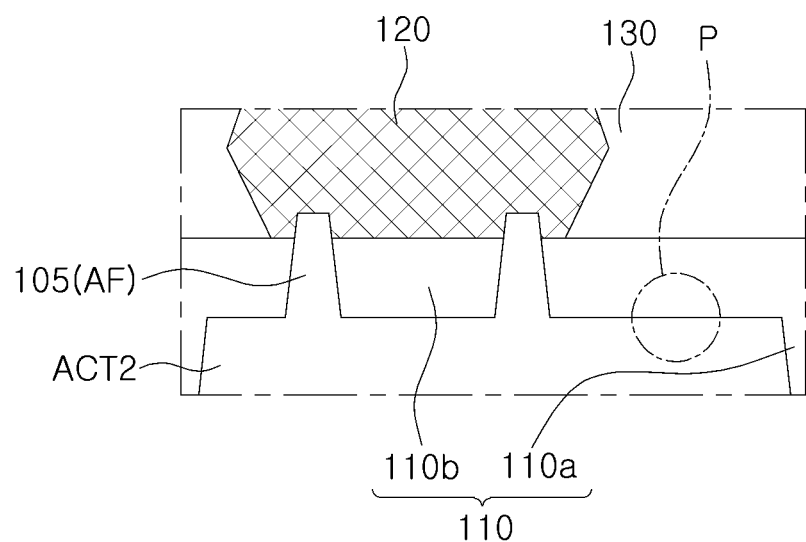

FIGS. 9A to 9C are enlarged cross-sectional views illustrating various examples related to a dummy fin.

A dummy fin DF', illustrated in FIG. 9A, may be almost removed by a fin-cut process such as an etching process. The fin-cut process may be performed in such a manner that, similarly to the dummy fins DF and DF' illustrated in FIG. 8, a portion of a fin pattern is removed to have a small height so that the fin pattern is not exposed from an upper surface of an isolation layer (110 in FIG. 8). In some embodiments, the dummy fin DF' may be sufficiently removed to remain in a form sharply protruding from an upper surface of an active region. When the dummy fin DF' is additionally etched, a dummy fin region DF" may have a concave structure, as illustrated in FIG. 9B. For example, the dummy fin region DF" is a recessed region of the second active region ACT2 where a fin pattern existed and then disappeared due to the additional etching. The concave structure DF", extending in the first direction D1 as described above, may also be understood to be a region in which the fin pattern is removed by intentionally applying etching. In other embodiments, only the active fins may be formed without the dummy fins by appropriately adjusting a pitch when a fin pattern is formed. In this case, as illustrated in FIG. 9C, a relatively planar bottom surface P, obtained during formation of an active fin (for example, an STI process), may be provided. For example, the standard cell illustrated in FIG. 3 may be manufactured in such a manner that a dummy fin is not formed by appropriately adjusting a pitch.

As described above, a dummy fin may have various structures, other than a fin structure similar to a structure of an active fin. For example, a dummy fin which extends in the first direction D1 may be a small portion, of an active region, protruding from an upper surface of an active region or a concaved region of an active region, according to a fin-cut process.

Figure 10A:
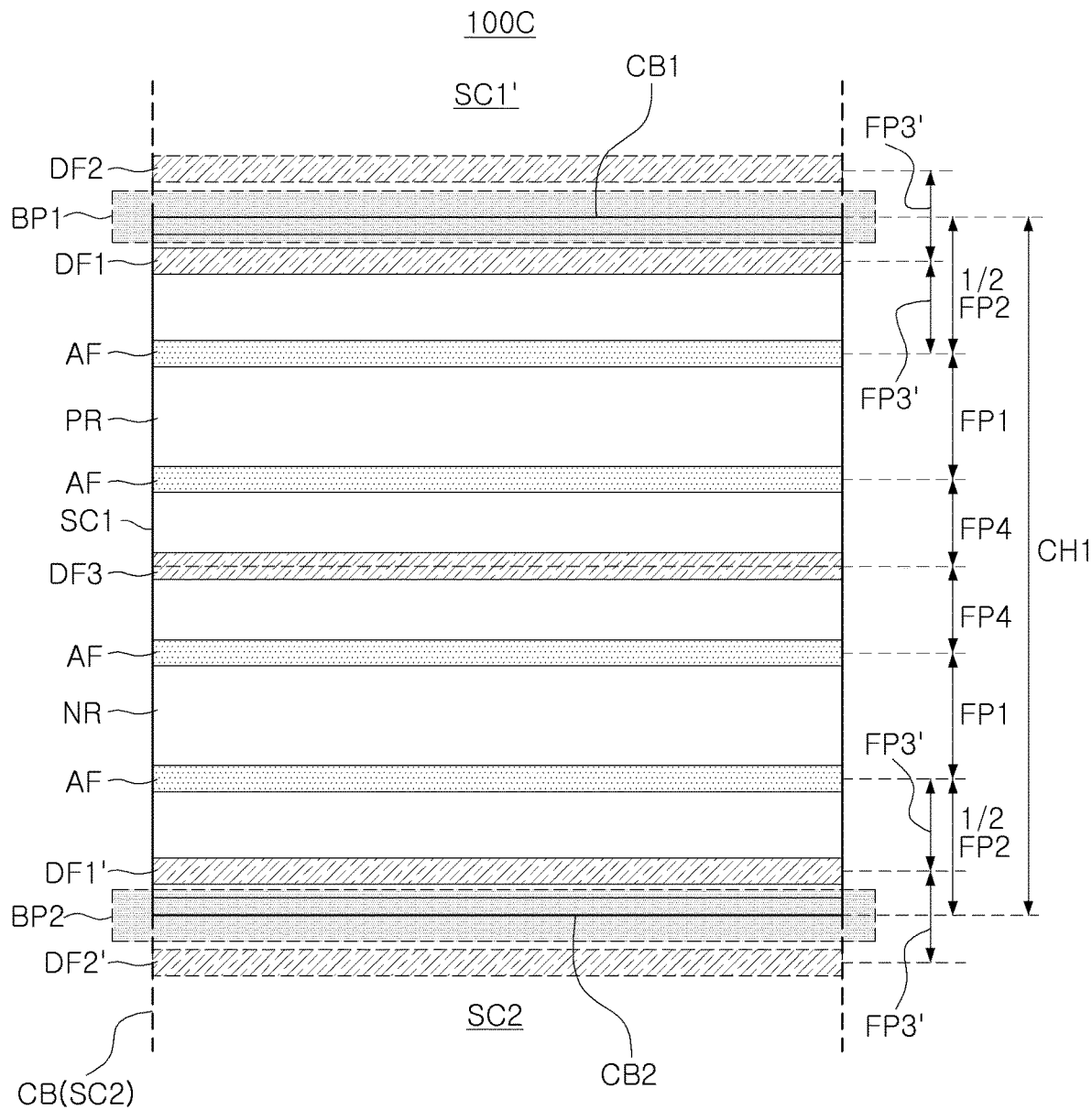
FIGS. 10A and 10B are layout diagrams of fin patterns of a standard cell and a final standard cell according to an example embodiment, respectively.
Figure 10B:
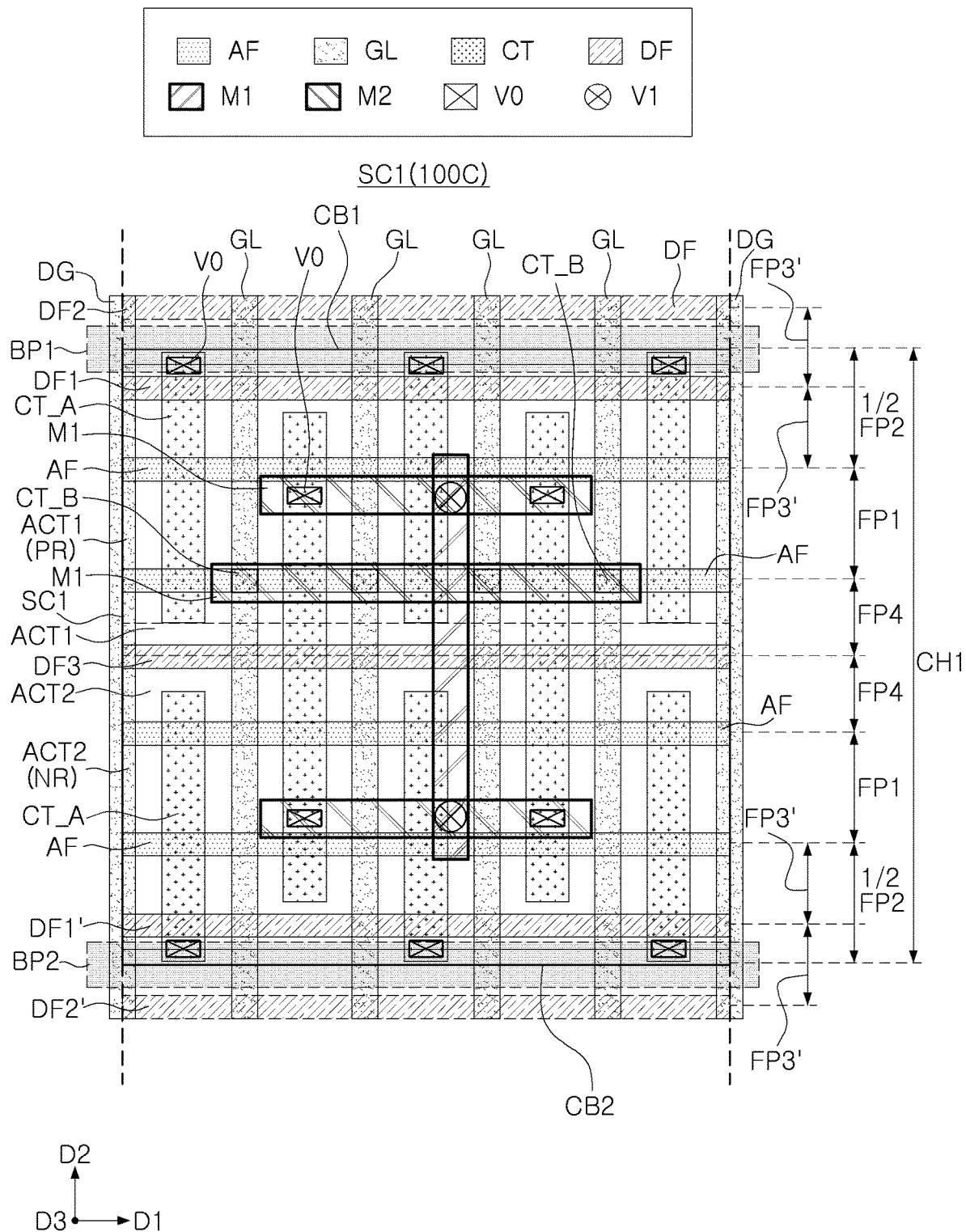

FIGS. 10A and 10B are layout diagrams of fin patterns of a standard cell and a final standard cell according to an example embodiment, respectively.

Referring to FIGS. 10A and 10B, a standard cell 100C according to the present embodiment may be understood to be similar to the standard cell 100, illustrated in FIGS. 2 to 5C, except that first and second buried power supply lines BP1 and BP2 are employed as power supply lines and fin patterns DF' adjacent to boundaries do not overlap the first and second buried power supply lines BP1 and BP2 in a third direction D3. Components of the present embodiment may be understood with reference to the descriptions of the same or similar components of the standard cell 100 illustrated in FIGS. 2 to 5C, unless otherwise specified.

Fin patterns of a standard cell 100C according to the present embodiment may include a plurality of active fins AF and a plurality of dummy fins DF and DF' which are disposed between the first and second boundaries CB1 and CB2. The first buried power supply line BP1 may be disposed between a first dummy pattern DF1 of the standard cell 100C and a second dummy pattern DF2 of another standard cell SC1' adjacent to the standard cell 100C. The first dummy pattern DF1 may be in a first active region PR and adjacent to the first boundary CB1 without overlapping the first buried power supply line BP1. The second dummy pattern DF2 which is disposed in another standard cell SC1' may be adjacent to the first boundary CB1 without overlapping the first buried power supply line BP1. Each of the first dummy pattern DF1 and the second dummy pattern DF2 may be spaced apart from the first boundary CB1 at the same distance (e.g., ½FP3'). The FP3' represents a pitch between the first dummy pattern DF1 and the second dummy pattern DF2. The second buried power supply line BP2 may be disposed between a first dummy pattern DF1' of the standard cell 100C and a second dummy pattern DF2' of another standard cell SC2 adjacent to the standard cell 100C. The first dummy pattern DF1' may be in a second active region NR and adjacent to the second boundary CB2 without overlapping the second buried power supply line BP2. The second dummy pattern DF2' which is disposed in another standard cell SC2 may be adjacent to the second boundary CB2 without overlapping the second buried power supply line BP2. Each of the first dummy pattern DF1' and the second dummy pattern DF2' may be spaced apart from the second boundary CB2 at the same distance (e.g., ½FP3'). The pitch between the first dummy pattern DF1' and the second dummy pattern DF2' may be the same as the pitch between the first dummy pattern DF1 and the second dummy pattern DF2. When the standard cell 100C is viewed in a plan view, a third dummy fin DF3 may be disposed on a boundary, which is shown as a dashed line, between the first and second active regions PR and NR.

As illustrated in FIGS. 10A and 10B, two active fins AF, respectively disposed in the first and second active regions PR and NR, may be arranged at a first pitch FP1, and the third dummy fin DF3 may be spaced apart, at a pitch FP4, from an active fin AF which is closest to the third dummy fin DF3. The pitch FP4 may be different from a pitch (e.g., FP1) between the two active fins AF which are disposed in each of the first and second active region PR and NR. One of the two active fins AF which are disposed in the first active region PR may be spaced apart, at a distance of ½FP2, from the first boundary CB1. One of the two active fins AF which are disposed in the second active region NR may be spaced apart, at the distance of ½FP2, from the second boundary CB2.

As described above, a cell height of the standard cell 100C employed in the present embodiment may be 2FP4+2FP1+FP2, and the fin patterns AF, DF1, DF1' disposed in the first active region PR and the second active region NR may be symmetrically arranged with respect to the third dummy pattern DF3.

A power supply line, employed in the present embodiment, may include first and second buried power supply lines PB1 and BP2, respectively buried in the first and second boundaries CB1 and CB2 between the adjacent standard cells SC1 and SC' and between the adjacent standard cells SC and SC2. Each of the first and second buried power supply lines BP1 and BP2 may be buried in an isolation layer (110 of FIG. 11A), disposed on the first and second boundaries CB1 and CB2, and/or an active region (102 of FIG. 11A). In the present embodiment, both the first and second power supply lines are illustrated as being provided as buried power supply lines. However, in some embodiments, only some of the first and second power supply lines may be provided as a buried power supply lines.

Among the dummy fins DF1, DF2, and DF3, the dummy fins DF1 and DF2 may be disposed closer to the first and second buried power supply lines BP1 and BP2, respectively, than the third dummy fin DF3, without overlapping the first and second buried power supply lines BP1 and BP2 in a vertical direction.

As illustrated in FIG. 10B, the standard cell 100C may include gate lines GL and DL, first and second contact structures CT_A and CT_B, first and second interconnection lines M1 and M2, and first and second power supply lines PM1 and PM2 which are added on the fin pattern layout illustrated in FIG. 10A. A unit circuit, implemented in the standard cell 100B of FIG. 10B, may be an inverter element including four p-type transistors and four n-type transistors disposed between the first and second power supply lines PM1 and PM2 to perform the same function as the layout of the standard cell illustrated in FIG. 10B. Each of the components of the present embodiment and connection relationships thereof will be understood with reference to what was described in FIGS. 4A and 4B.

Figure 11A:
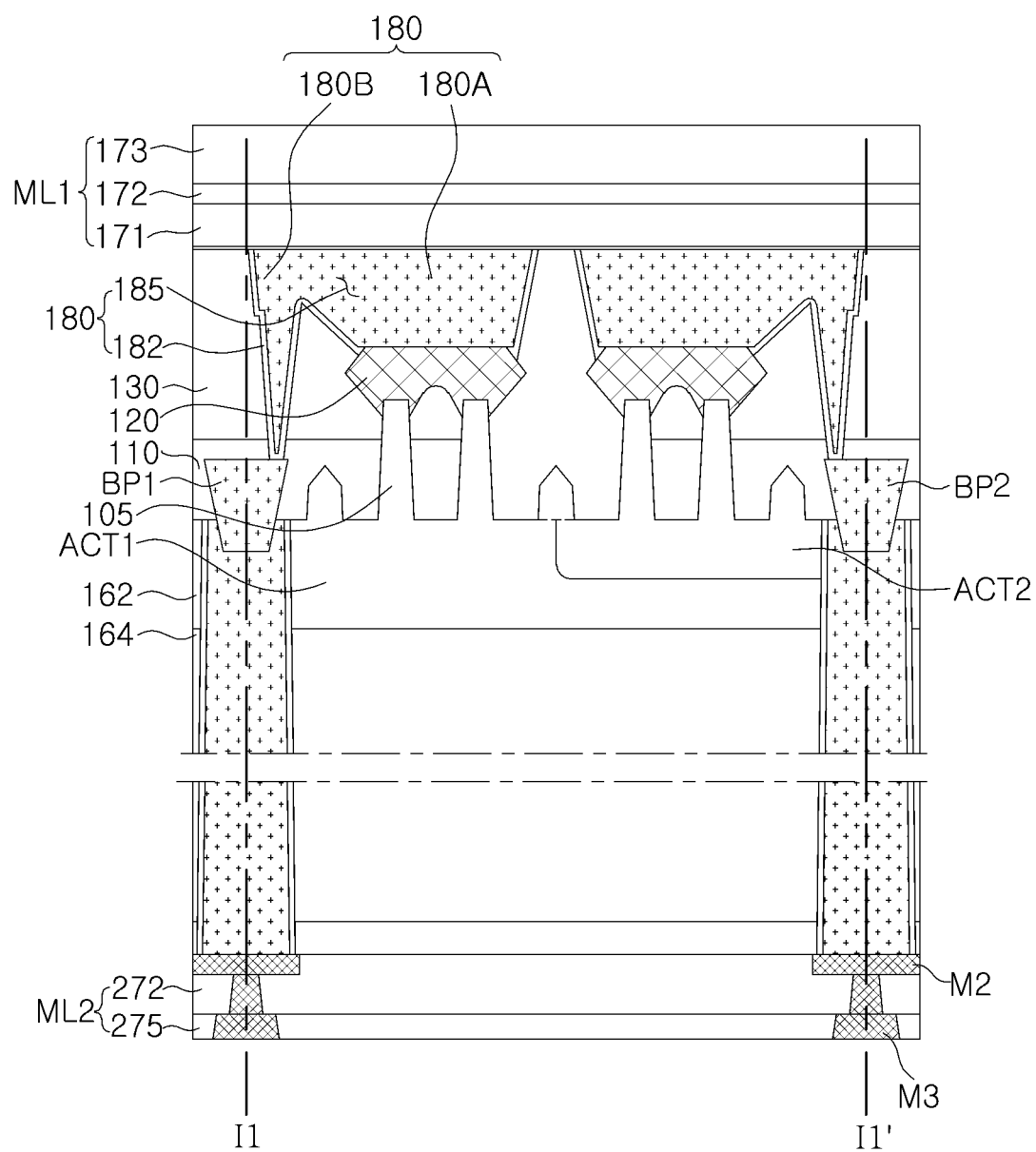
FIGS. 11A and 11B are cross-sectional views of the standard cell of FIG. 10B, taken along lines I1-I1' and II-II' of FIG. 10B, respectively.
Figure 11B:
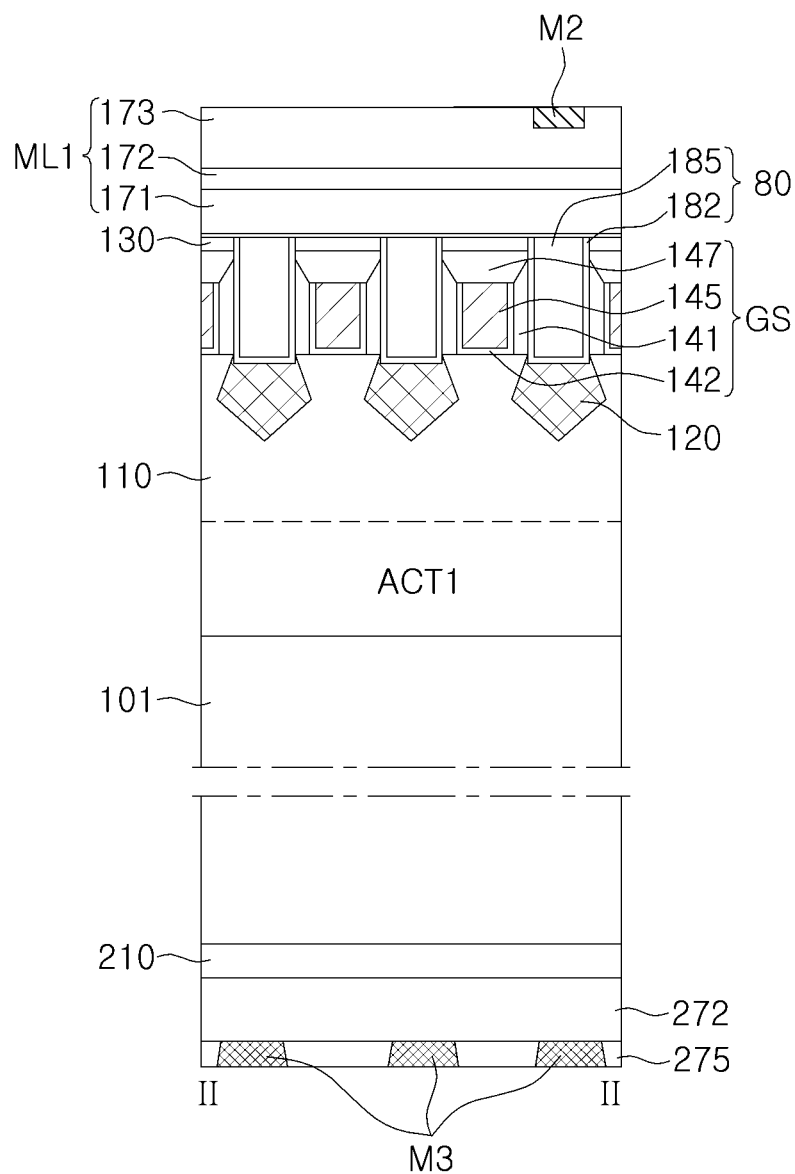
Figure 11C:
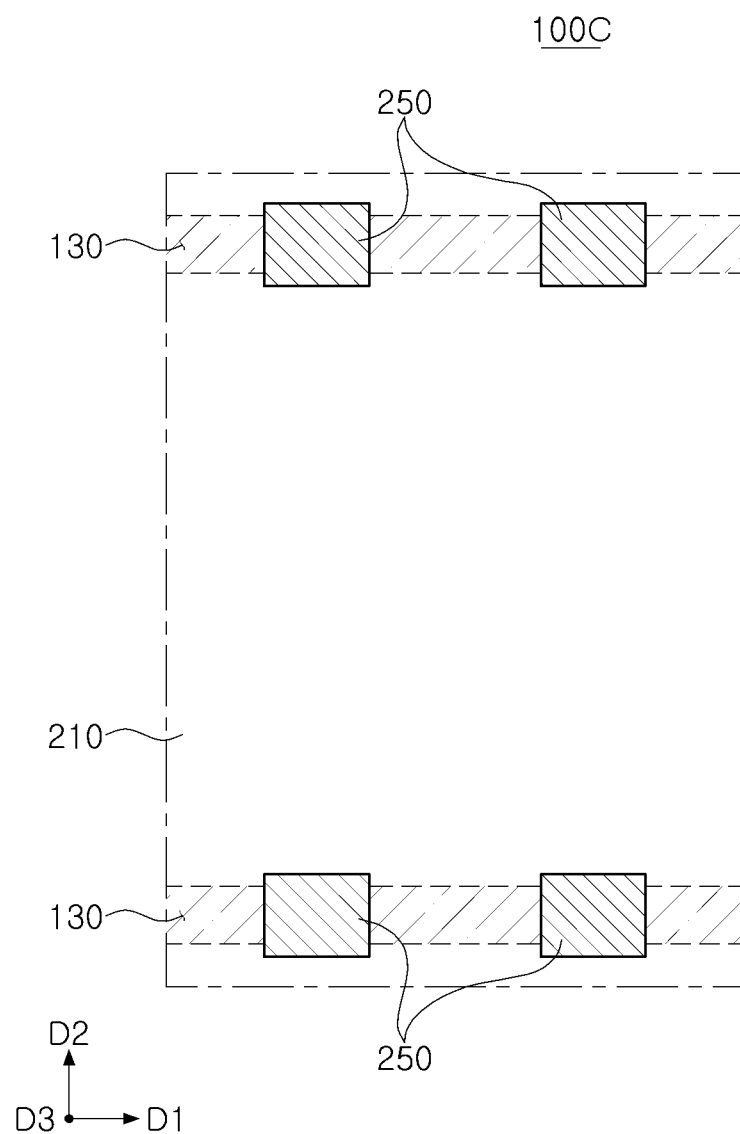
FIG. 11C is a bottom view of the standard cell of FIG. 10B.

FIGS. 11A and 11B are cross-sectional views of the standard cell of FIG. 10B, taken along lines I1-I1' and II-II' of FIG. 10B, respectively, and FIG. 11C is a bottom view of the standard cell of FIG. 10B.

Referring to FIGS. 11A and 11B, a standard cell 100C according to the present embodiment may include a substrate 101 having an active region 102. A plurality of active fins 105 may be disposed on the active region 102.

Similarly to the previous embodiment, each of the plurality of active fins 105 may have a structure protruding from an upper surface of the active region 102 in a third direction D3. The plurality of active fins 105 may be arranged parallel to each other on the upper surface of the active region 102 to extend in a first direction D1. The active fins 105 may be provided as an active region of each transistor. In the present embodiment, two active fins 105 are connected to a source/drain region 120, but the number of active fins which are connected to the source/drain region 120 is not limited thereto. In other embodiments, one, or three or more active fins 105 may be provided. As the number of the active fins 105 connected to a source/drain region increases, a width of channel region of a transistor increases.

Source/drain regions 120 may be formed in some regions of the active fins 105 disposed on opposite sides adjacent to the gate structure GL. In the present embodiment, the source/drain region 120 may have an upper surface having a higher level than an upper surface of the active fin 105 by forming a recess in a certain region of the active fin 105 and performing selective epitaxial growth on the recess.

The standard cell 100C according to the present embodiment may include a gate structure GL. Referring to FIGS. 10B and 11B, the gate structure GL may have a line structure extending in the second direction D2. The gate structure GL may overlap one region of the active fins 105.

The gate structure GL, employed in the present embodiment, may include gate spacers 141, a gate insulating layer 142 and a gate electrode 145 sequentially disposed between the gate spacers 141, and a gate capping layer 147 disposed on the gate electrode 145.

The standard cell 100C may include an isolation layer 110. The isolation layer 110 may include a first isolation region 110a, defining an active region 102, and a second isolation region 110b adjacent to the first isolation region 110a and defining a plurality of active fins 105 (see FIG. 5A).

The standard cell 100C according to the present embodiment may include first and second buried power supply lines BP1 and BP2 buried in the second isolation region 110b to the active region 102. For example, the first and second buried power supply lines BP1 and BP2 may be divided into a portion buried in the second isolation region 110b and a portion buried in the active region 102. The first and second buried power supply lines BP1 and BP2 may extend in the first direction D1 along boundaries CB1 and CB2 of a standard cell.

A conductive through-structure 250 may include a filled through-via 255, extending from a lower surface of the substrate 101 toward an upper surface of the substrate 101, and an insulating liner 251 disposed between the through-via 255 and the substrate 101. For example, the conductive through-structure 250 may be a through-silicon via (TSV). The conductive through-structure 250 may be formed from the rear surface of the substrate 101 to be connected to the first and second buried power supply lines BP1 and BP2.

A lower interlayer insulating layer 130 may be disposed on the isolation layer 110 to cover the source/drain regions 120 and the first and second buried power supply lines BP1 and BP2. The second isolation region 110b of the isolation layer 110 may include portions covering the first and second buried power supply lines BP1 and BP2.

Each of the first and second buried power supply lines BP1 and BP2 may have an upper surface lower than an upper end of the active fin 105. For example, the first and second buried power supply lines BP1 and BP2 may not be exposed outwardly during a process of forming the source/drain region 120. The upper surfaces of the first and second buried power supply lines BP1 and BP2 may be higher than upper surfaces of the first and second active regions ACT1 and ACT2.

The first and second buried power supply lines BP1 and BP2 may be electrically connected to the first contact structure 180 or CT_A. In some embodiments, the first contact structure 180 may include a conductive barrier 182 and a contact plug 185.

The first contact structure 180, employed in the present embodiment, may be connected to each of the source/drain regions 120 and the first and second buried power supply lines BP1 and BP2. The first contact structure 180 may include a first contact portion 180A, connected to the source/drain region 120, and an extension portion 180B connected to the first contact portion 180A and connected to the first and second buried power supply lines BP1 and BP2. The extension portion 180B may extend deeper than the first contact portion 180A to be electrically connected to each of the first and second buried power supply lines BP1 and BP2.

The first contact structure 180 may be connected to a first interconnection portion ML1 constituting back end of lines (BEOL). The first interconnection portion ML1 may connect a plurality of devices (for example, transistors) implemented on the active region 102 of the substrate 101 with each other. Similarly to the previous embodiment, the first interconnection portion ML1 may include a plurality of dielectric layers 171, 172, and 173, first to second interconnection lines M1 and M2, and vias V0 and V1. An etch-stop layer may be further included below the dielectric layers 171, 172, and 173.

In the present embodiment, a plurality of elements (for example, the source/drain region 120, and the like) formed on the substrate 101 may be connected to a second interconnection portion ML2, disposed on the rear surface of the substrate 101, through the first and second buried power supply lines BP1 and BP2 and the conductive through-structure 250. The second interconnection portion ML2 may be a power supply line and signal supply lines implemented on the rear surface of the substrate 101, and will be understood to be an interconnection structure replacing a portion of required BEOL. The second interconnection portion ML2 may provide a signal line and a power supply line for a plurality of elements (for example, transistors) implemented on the upper surface of the substrate 101 through the buried power supply line BP and the conductive through-structure 250.

An insulating layer 210 may be formed on the rear surface of the substrate 101, and then the conductive through-structure 250 may be formed thereon. The second interconnection portion ML2 may be provided on the insulating layer 210. The second interconnection portion ML2 may include a plurality of low-k dielectric layers 272 and 275, interconnection lines M3 and M4, and a via V2.

FIG. 11C illustrates a layout of the conductive through-structure 250 and the first and second buried power supply lines BP1 and BP2, when viewed from a lower surface of the substrate 101. A plurality of conductive through-structures 250 may be arranged to be connected to the first and second buried power supply lines BP1 and BP2 extending in a first direction D1. In FIG. 11C, a cross section of the conductive through-structure 250 is illustrated as having a substantially rectangular shape in which a length in the first direction D1 is greater than a length in a second direction D2, perpendicular to the first direction D1. However, in other embodiments, the conductive through-structure 250 may have another shape (for example, a circular shape or an elliptical shape), among various other shapes. In the present embodiment, the conductive through-structures 250 are illustrated as being arranged on the same line in the second direction D2. However, in other embodiments, the conductive through-structures 250 may have another arrangement. For example, the conductive through-structures 250 may be arranged in a zig-zag manner in the second direction D2 or in the first direction D1.

The semiconductor device according to the present embodiment may include a plurality of groups of standard cells, respectively arranged in a plurality of rows and having different cell heights. FIGS. 12 to 18 illustrate only a form in which first and second standard cells having different heights are arranged in a second direction D2, but the first and second standard cells are portion "B" corresponding to the layout illustrated in FIG. 2 and will be understood to be a shape in which a plurality of standard cells having the same height are arranged in a row direction.

Figure 12:
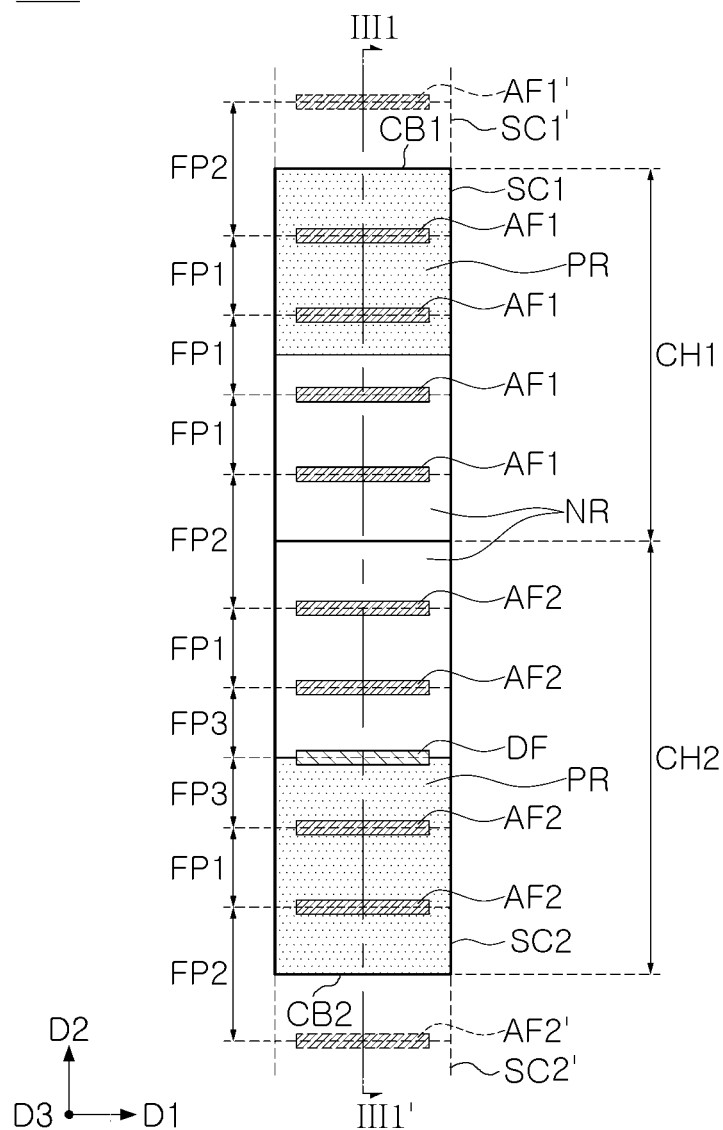
FIG. 12 is a layout diagram of fin patterns of a semiconductor device (standard cells) according to an example embodiment.
Figure 13:
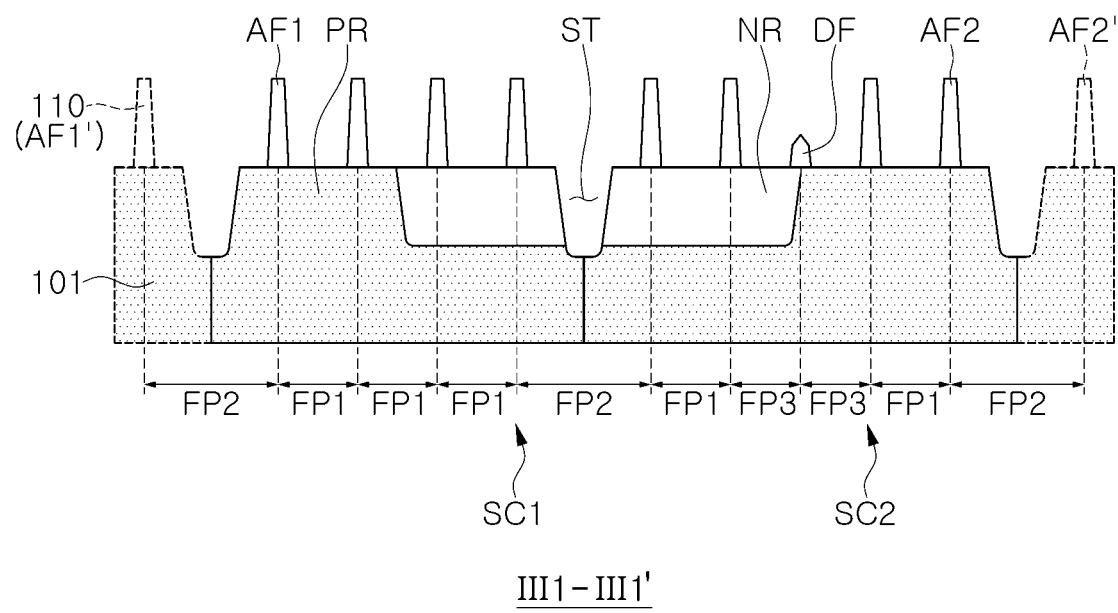
FIG. 13 is a cross-sectional view of the semiconductor device of FIG. 12, taken along line III1-III1' of FIG. 12, and illustrates an arrangement of the fin patterns.

FIG. 12 is a layout diagram of fin patterns of a semiconductor device (standard cells) according to an example embodiment, and FIG. 13 is a cross-sectional view of the semiconductor device of FIG. 12, taken along line III1-III1' of FIG. 12, and illustrates an arrangement of the fin patterns.

Referring to FIGS. 12 and 13, a semiconductor device 200 according to the present embodiment may includes a first standard cell SC1 and a second standard cell SC2 arranged in a second direction D2. The first and second standard cells SC1 and SC2 may have a first height CH1 and a second height CH1 and CH2, different from each other, defined in a second direction D2, respectively. For example, the second height CH2 may be greater than the first height CH1. As described above, each of the first and second standard cells SC1 and SC2 may include a plurality of standard cells, although not illustrated for the simplicity of drawings, having the same height in a column direction (for example, a second direction D2) to constitute a semiconductor device similar to the semiconductor device (see FIG. 2). At least one of the standard cells in each of the first and second standard cells SC1 and SC2 may be different from the others in the same standard cell in a width defined in the first direction D1.

Each of the first and second standard cells SC1 and SC2 may include a first active region PR and a second active region NR arranged in the second direction D2, and active regions having the same conductivity type, for example, the second active regions NR may be arranged to face each other on a boundary between the first and second standard cells SC1 and SC1 which are in contact with each other. The semiconductor device 200A according to the present embodiment, as illustrated in FIG. 14, may have a trench for isolating elements disposed on boundaries of the first and second standard cells SC1 and SC2 (corresponding to a deep isolation region 110a of FIG. 5A).

Similarly to the layout of the fin pattern illustrated in FIG. 3, the first standard cell SC1 may include only active fins AF1 without a dummy fin. Two active fins AF1 which may be spaced apart, in the second direction D2 at a first pitch FP1, from each other may be disposed in each of the first and second active regions PR and NR. The active fins AF1 are not disposed on a first boundary CB1 which is disposed between two standard cells SC1 and SC1' and a boundary between two standard cells SC1 and SC2.

The second standard cell SC2, which is in contact with the first standard cell SC1, may include a plurality of active fins AF2 and a single dummy fin DF. Two active fins AF2 may be arranged in each of the first and second active regions PR and NR. A pitch FP3 between the active fin AF2 and the dummy fin DF may be different from a pitch FP1 between the active fins AF2. The active fin AF2 and the dummy fin DF are not disposed on the second boundary CB2 which is a boundary between the standard cells SC2 and SC2'.

A pair of active fins AF1 and AF2 adjacent to a boundary between the first standard cell SC1 and the second standard cell SC2 may be arranged at a second pitch FP2, and each of the pair of active fins AF1 and AF2 may be spaced apart, in the second direction D2, from the boundary between the first standard cell SC1 and the second standard cell SC2 at the same interval ½FP2.

Figure 14A:
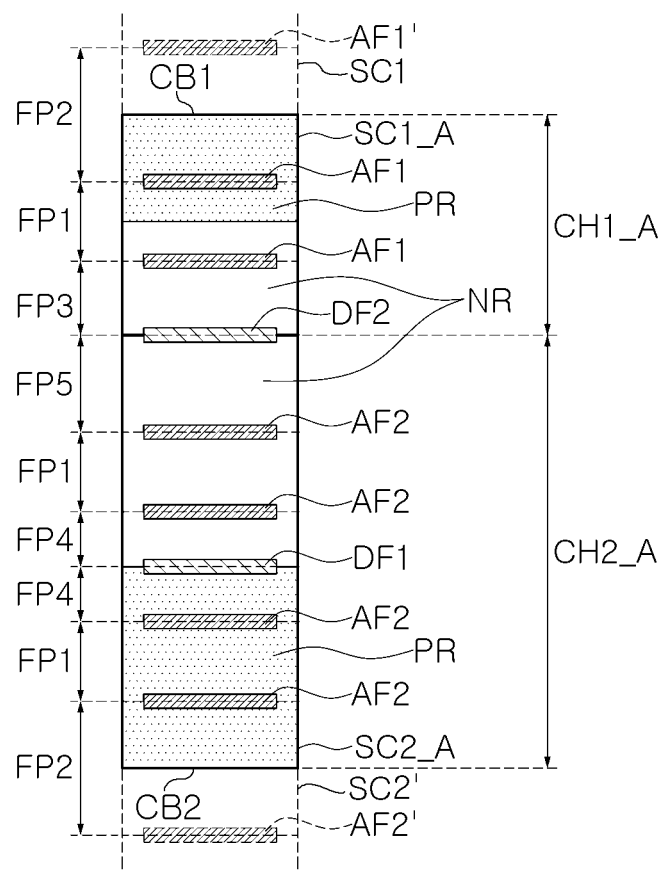
FIGS. 14A and 14B are layout diagrams of fin patterns of a semiconductor device according to various embodiments.
Figure 14B:
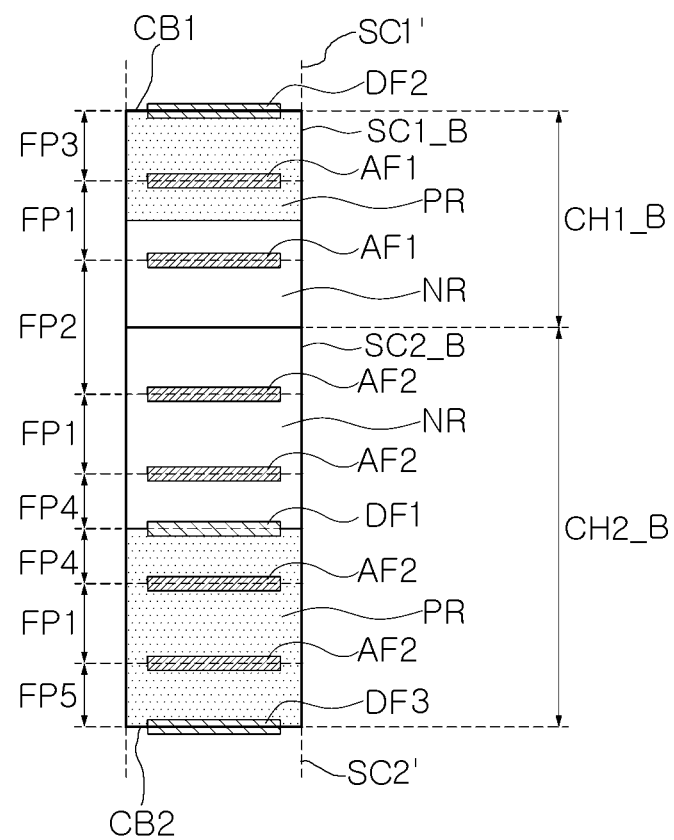

FIGS. 14A and 14B are layout diagrams of fin patterns of a semiconductor device according to various embodiments.

A semiconductor device 200A, illustrated in FIG. 14A, may include a first standard cell SC1_A having a first height CH1_A and a second standard cell SC2_A having a second height CH2_A different from the first height CH1_A.

The first standard cell SC1_A may include two fins AF1 arranged at a first pitch FP1. A single active fin AF1 may be arranged in respective first and second active regions PR and NR in the first standard cell SC1_A. The second standard cell SC2_A may include a plurality of active fins AF2 and a first dummy fin DF1. Two active fins AF2 may be arranged at the first fitch FP1 in each of the first and second active regions PR and NR of the second standard cell SC2_A. The first dummy fin DF1 may be spaced apart, in the second direction D2 at a pitch FP4, from its adjacent active fin AF2. The pitch FP4 may be different from the pitch FP1.

A second dummy fin DF2 may be disposed on the boundary between the first and second standard cells SC1_A and SC1_B which are in contact with each other. The second dummy fin DF2 may be spaced apart, in the second direction D2 at a pitch FP3, from its adjacent active fin AF1 in the first standard cell SC1_A, and may be spaced apart, in the second direction D2 at a pitch FP5, from its adjacent active fin AF2 in the second standard cell CS2_A. The pitch FP3 may be different from the pitch FP5. The second dummy fin DF2 may extend lengthwise in the first direction D1, and may partially overlap each of the first and second standard cells SC1_A and SC1_B.

As described above, due to the presence of the first dummy pattern DF1 in the second standard cell SC2_A, the first and second standard cells SC1_A and SC2_A may have an asymmetric fin pattern arrangement in the first and second active regions PR and NR with respect to the second dummy patter DF2 on the boundary between the first and second standard cells SC1_A and SC2_A. For example, in the first standard cell SC1_A, one of the two active fins AF1 may have a pitch FP2 with another active fin AF1' in a standard cell SC1' which is adjacent to the first standard cell SC1_A, and the other of the two active fins AF1 may have a pitch FP3, different from the pitch ½FP2, with the second dummy fin DF2. In the second standard cell SC2_A, one of the two active fins AF2 in the second active region NR may have a pitch FP5 with the second dummy fin DF2, and the other of the two active fins AF2 may have a pitch FP4, different from the pitch FP5, with the first dummy fin DF1. In the second standard cell SC2_A, one of the two active fins AF2 in the first active region PR may have a pitch FP4 with the first dummy fin DF1, and the other of the two active fins AF2 may have a pitch FP2, different from the pitch FP4, with another active fin AF2' in a standard cell SC2' which is adjacent to the standard cell SC2_A. As shown in the second standard cell SC2_A, when each of the active regions PR and NR includes a plurality of active fins, a pitch or a distance, a comparison target in the semiconductor device manufacturing step S80 of the fabrication process step FAB, of the active regions may be defined or represented by the smallest pitch between a boundary and an active fin closest to the boundary, among the plurality of active fins. For example, a pitch of the first active region PR of the second standard cell SC2_A may be represented by the pitch FP4, which is smaller than ½FP2, between the first dummy DF1 and the active fin AF2.

A semiconductor device 200B illustrated in FIG. 14B will be understood to be similar to the semiconductor device 200A illustrated in 14A, except that no dummy fin is disposed on a boundary between first and second standard cells SC1_B and SC2_B which are in contact with each other and dummy fins DF2 and DF3 are disposed on a first boundary CB1 between the first standard cell SC1_B and a standard cell SC1' adjacent to the first standard cell SC1_B, and a second boundary CB2 between the second standard cell SC2_B and a standard cell SC2', respectively. Components of the present embodiment may be understood with reference to the descriptions of the same or similar components of the semiconductor device 200A illustrated in FIG. 14A, unless otherwise specified.

The first and second standard cells SC1_B and SC2_B may also have different heights CH1_B and CH2_B, and may be arranged in a second direction D2. No dummy fin may be arranged on the boundary between the first and second standard cells SC1_B and SC2_B which are in contact with each other, and as described above, the dummy fins DF2 and DF3 may be disposed on the first boundary CB1 and the second boundary CB2, respectively. In an embodiment, the dummy fin DF2 may extend lengthwise in the second direction D2 along the first boundary CB1, partially overlapping each of the standard cells SC1_B and SC1', and the DF3 may extend lengthwise in the second direction D2 along the second boundary CB2, partially overlapping each of the standard cells SC1_B and SC2'.

As described above, in the present embodiment, since a fin pattern is disposed on only a one side boundary based on a single cell, both the first and second standard cells SC1_B and SC2_B may have an asymmetric pattern arrangement in the first and second active regions PR and NR. Since the first and second standard cells SC1_B and SC2_B have dummy fins DF2 and DF3 only on a one side boundary (e.g., the first and second boundaries CB1 and CB2, respectively) and the second standard cell SCB2_B has a dummy fin DF1 on a boundary between the first and second active regions PR and NR, the first and second standard cells SC1_B and SC2_B may have active fins which are asymmetrically arranged in the first and second active regions PR and NR therein.

Figure 15:
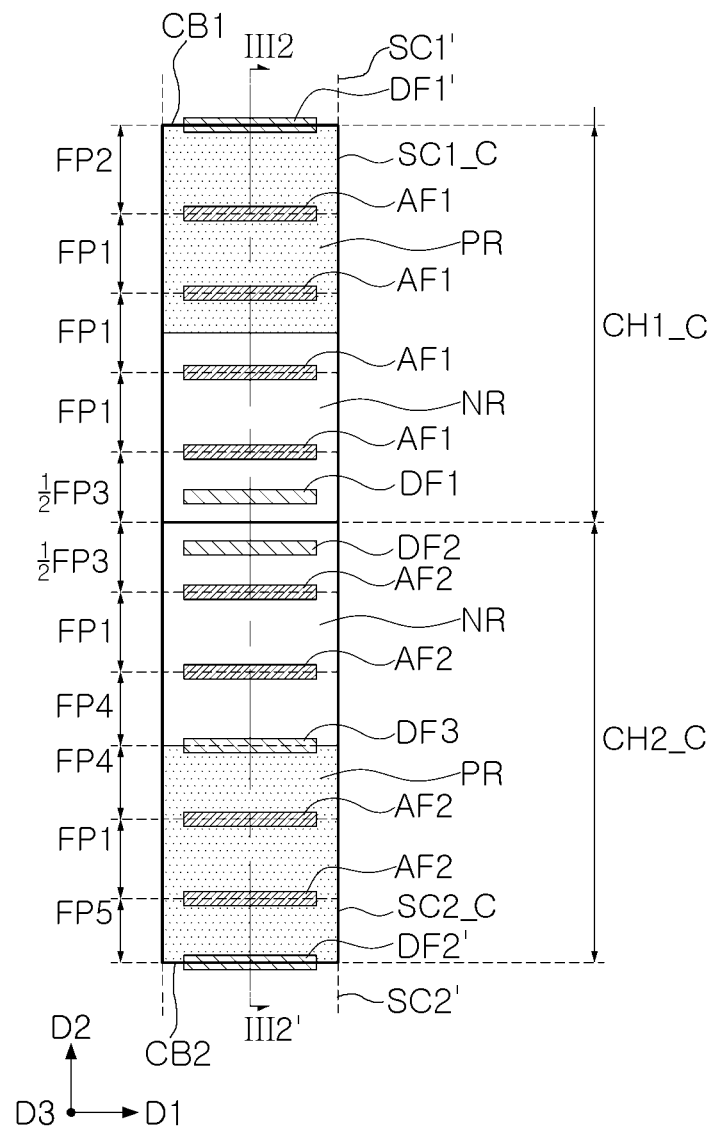
FIG. 15 is a layout diagram of fin patterns of a semiconductor device (standard cells) according to an example embodiment.
Figure 16:
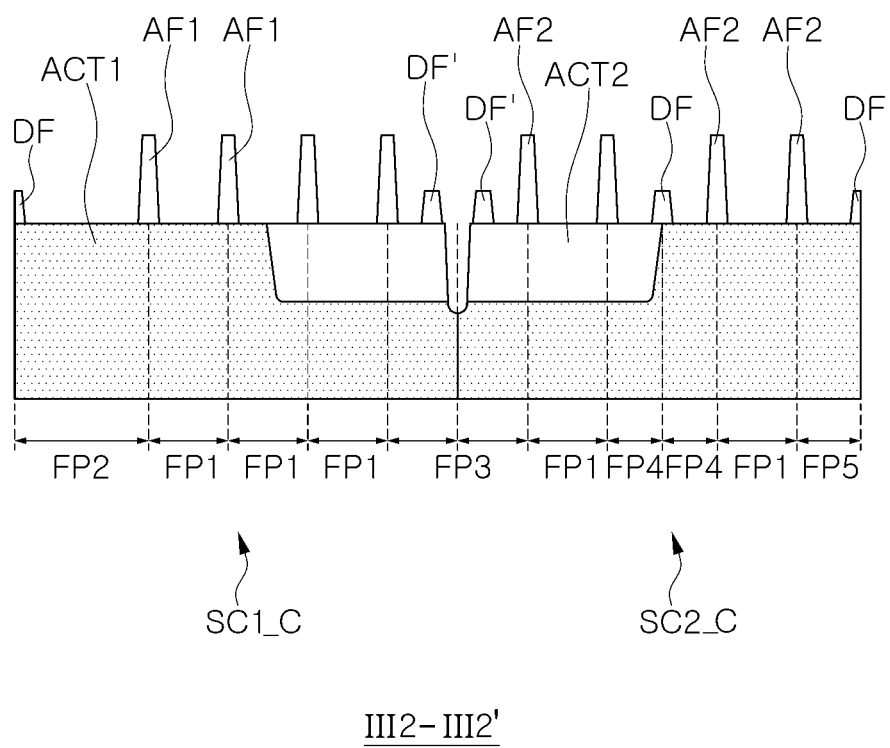
FIG. 16 is a cross-sectional view of the semiconductor device of FIG. 15, taken along line III2-III2' of FIG. 15, and illustrates an arrangement of the fin patterns.

FIG. 15 is a layout diagram of fin patterns of a semiconductor device (standard cells) according to an example embodiment, and FIG. 16 is a cross-sectional view of the semiconductor device of FIG. 15, taken along line III2-III2' of FIG. 15, and illustrates an arrangement of the fin patterns.

Referring to FIGS. 15 and 16, a semiconductor device 200C according to the present embodiment will be understood to be similar to the semiconductor device 200 illustrated in FIGS. 12 and 13, except that a dummy fin DF is disposed on a one side boundary and a pair of adjacent dummy fins DF' are disposed on the other side boundary. Components of the present embodiment may be understood with reference to the descriptions of the same or similar components of the semiconductor device 200 illustrated in FIGS. 12 and 13, unless otherwise specified.

Similarly to the layout of the fin pattern illustrated in FIG. 7A, a first standard cell SC1_C may include a plurality of active fins AF1 and two dummy fins DF1 and DF1'. Two active fins AF1 may be arranged at a first pitch FP1 in respective first and second active regions PR and NR of the first standard cell SC1_C. A second standard cell SC2_C, which is in contact with the first standard cell SC1_C, may also include a plurality of active fins AF2 and a plurality of dummy fins DF2 and DF2', and DF3. Two active fins AF2 may be arranged in each of the first and second active regions PR and NR of the second standard cell SC2_C. A pitch FP4 of the active fin AF1 and the dummy fin DF3 may be different from a pitch FP1 of the active fins AF2.

No fin pattern may be arranged on a boundary between the first standard cell SC1_C and the second standard cell SC2_C which are in contact with each other, but one of two adjacent dummy fins DF1 and DF2 may be disposed in one side (i.e., in the first standard cell SC1_C) of the boundary between the first and second standard cells SC1_C and SC, and the other may be disposed in the other side of the boundary (i.e., in the second standard cell SC2_C). The two adjacent dummy fins DF1 and DF2 may be arranged to have the same distance from the boundary. The active fins AF1 and AF2 of the first and second standard cells SC1_C and SC2_C adjacent to the boundary may be arranged at a constant pitch ½FP3 with the boundary interposed therebetween. Each of the dummy fins DF1' and DF2' may be disposed on the other side boundary of a corresponding one of the first standard cell SC1_C and the second standard cell SC2_C. For example, the dummy fins DF1' and DF2' may be disposed on the boundaries CB1 and CB2, respectively. The boundary CB1 may be disposed between the second standard cell SC2_C and a standard cell SC2' which is adjacent thereto. The boundary CB2 may be disposed between the first standard cell SC1_C and a standard cell SC1' which is adjacent thereto.

As described above, fin patterns of the first and second active regions PR and NR may be asymmetrically arranged in each of the first and second standard cells SC1_C and SC2_C. For example, in the first standard cell SC1_C, an active fin AF1 may be spaced apart from the boundary CB1 at a pitch FP2, and another active fin AF1 may be spaced apart at a pitch ½FP3 from the boundary between the first and second standard cells SC1_C and SC2_C. The pitch FP2 and the pitch ½FP3 may be different from each other. In the first standard cell SC2_C, an active fin AF1 may be spaced apart from the boundary CB2 at a pitch FP5, and another active fin AF1 may be spaced apart at the pitch ½FP3 from the boundary between the first and second standard cells SC1_C and SC2_C. The pitch FP5 and the pitch ½FP3 may be different from each other.

Figure 17A:
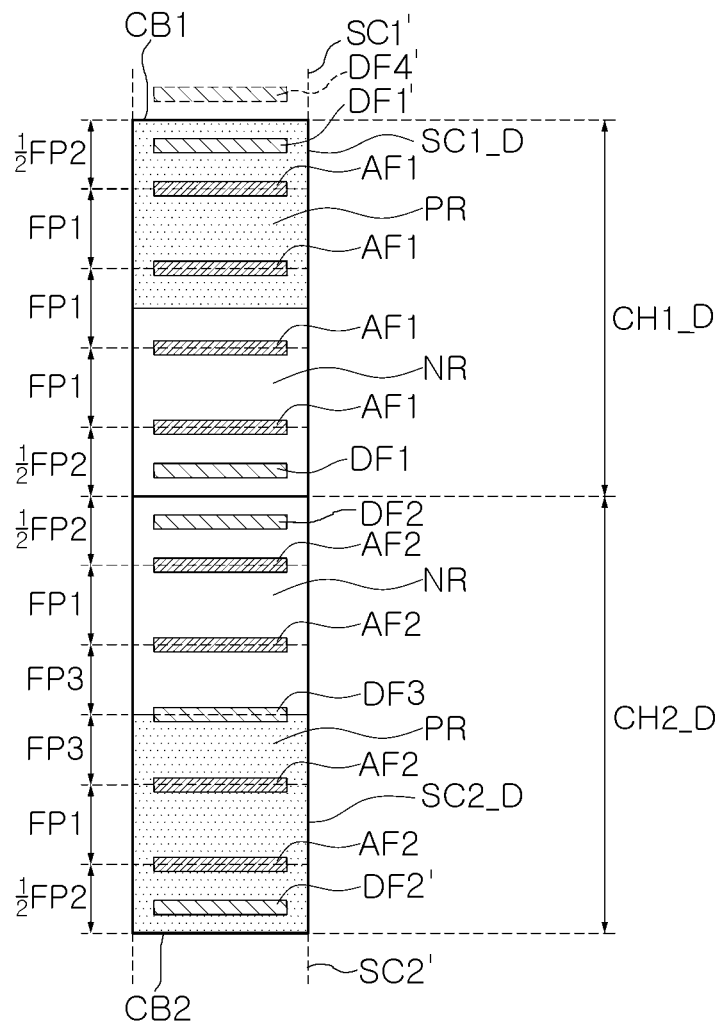
FIGS. 17A and 17B are layout diagrams of fin patterns of a semiconductor device according to various embodiments.

A semiconductor device 200D illustrated in FIG. 17A will be understood to be similar to the semiconductor device 200C illustrated in FIG. 15, except that no dummy fin DF is disposed on a boundary between first and second standard cells SC1_D and SC2_D which are in contact with each other, and on a first boundary CB1 between the first standard cell SC1_D and a standard cell SC1' adjacent thereto. Components of the present embodiment may be understood with reference to the descriptions of the same or similar components of the semiconductor device 200C illustrated in FIG. 15, unless otherwise specified.

The first and second standard cells SC1_D and SC2_D may have different heights CH1_D and CH2_D and may be arranged in a second direction D2. No dummy fin may be disposed on the boundary between the first and second standard cells SC1_D and SC2_D which are in contact with each other, and the first boundary CB1. Dummy fins DF1 and DF2 adjacent to the boundary between the first and second standard cells SC1_D and SC2_D may be spaced apart from each other. Dummy fins DF1' and DF2' may be adjacent to the first boundary CB1 and the second boundary CB2, respectively. The fin patterns of each of the first and second standard cells SC1_D and SC2_D, employed in the present embodiment, may be arranged in a symmetrical structure, respectively.

Figure 17B:
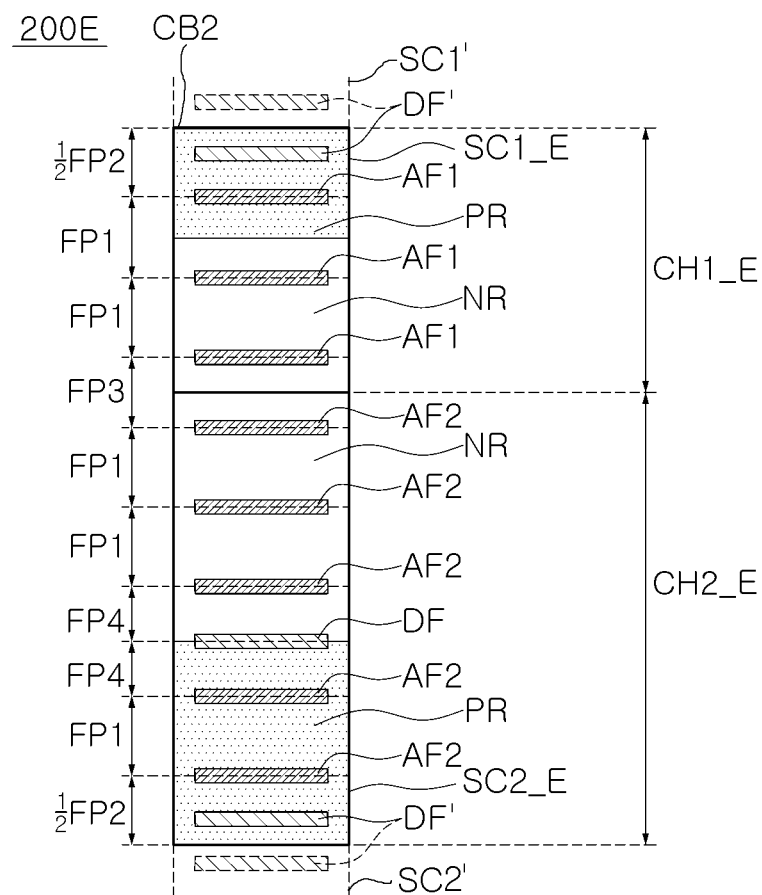

A semiconductor device 200E, illustrated in FIG. 17B, may include first and second standard cells SC1_E and SC2_E having different heights CH1_E and CH2_E.

The first standard cell SC1_E may include three active fins AF1, arranged at a first pitch FP1, and a single dummy fin DF' adjacent to a first boundary CB1 between the first standard cell SC1_E and a standard cell SC1' adjacent thereto. For example, one active fine AF1 may be disposed in a first active region PR of the first standard cell SC1_E, and two active fins AF1 may be arranged in a second active region NR of the first standard cell SC1_E. In some embodiments, a different number of active fins may be disposed in each of the active regions PR and NR in the first standard cell SC1_E.

The second standard cell SC2_E may include five active fins AF2 and two dummy fins DF and DF'. Two active fins AF2 may be disposed in the first active region NR of the second standard cell SC2_E, and three active fins AF2 may be disposed in the second active region NR of the second standard cell SC2_E. In each of the active regions PR and NR, active fins may be arranged at the same pitch FP1. A pitch FP4 of an active fin AF1 and the dummy fin DF may be different from a pitch FP1 of the active fins AF2.

No dummy fin may be disposed on a boundary between the first and second standard cells SC1_E and SC1_E which are in contact with each other, and the two dummy fins DF' may be adjacent to the first and second boundaries CB1 and CB2 at the same pitch, respectively.

Figure 18:
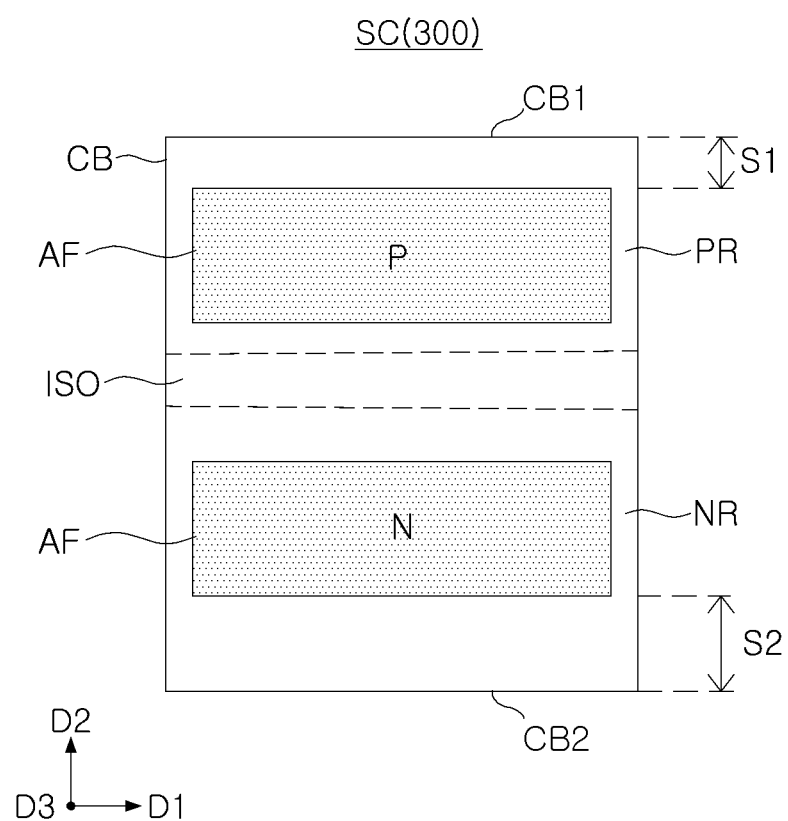
FIG. 18 is a layout diagram of active fins of a standard cell according to an example embodiment.

FIG. 18 is a layout diagram of active fins of a standard cell according to an example embodiment.

Referring to FIG. 18, a standard cell SC according to the present embodiment may include two active fins AF (or active patterns). One of the two active fin AF may be disposed in a first active region PR, and the other active fin AF may be disposed in a second active region NR. The first and second active regions PR and NR are divided by an isolation region ISO. Each of the active fins AF, employed in the present embodiment, may be arranged at different intervals (S1<S2) from adjacent first and second boundaries CB1 and CB2. A fin pattern layout of such a standard cell SC may be used to implement a unit circuit including a transistor provided with a nanosheet (for example, MBCFE®) and is illustrated as a semiconductor device 300 in FIGS. 20A and 20B.

Figure 19A:
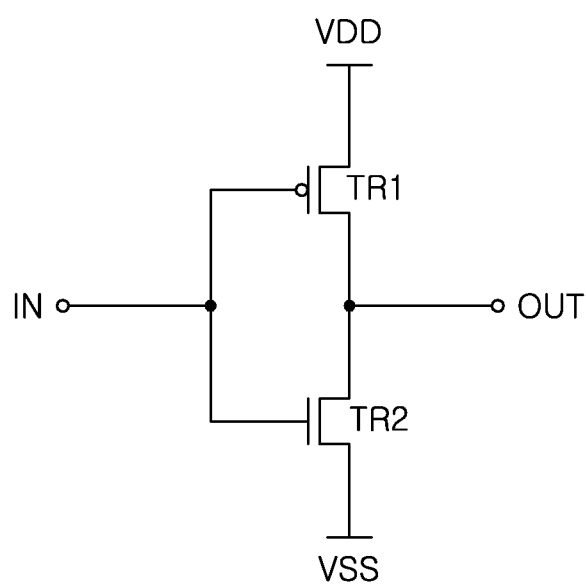
FIGS. 19A and 19B are an equivalent circuit diagram and a layout diagram of a standard cell according to an example embodiment, respectively.
Figure 19B:
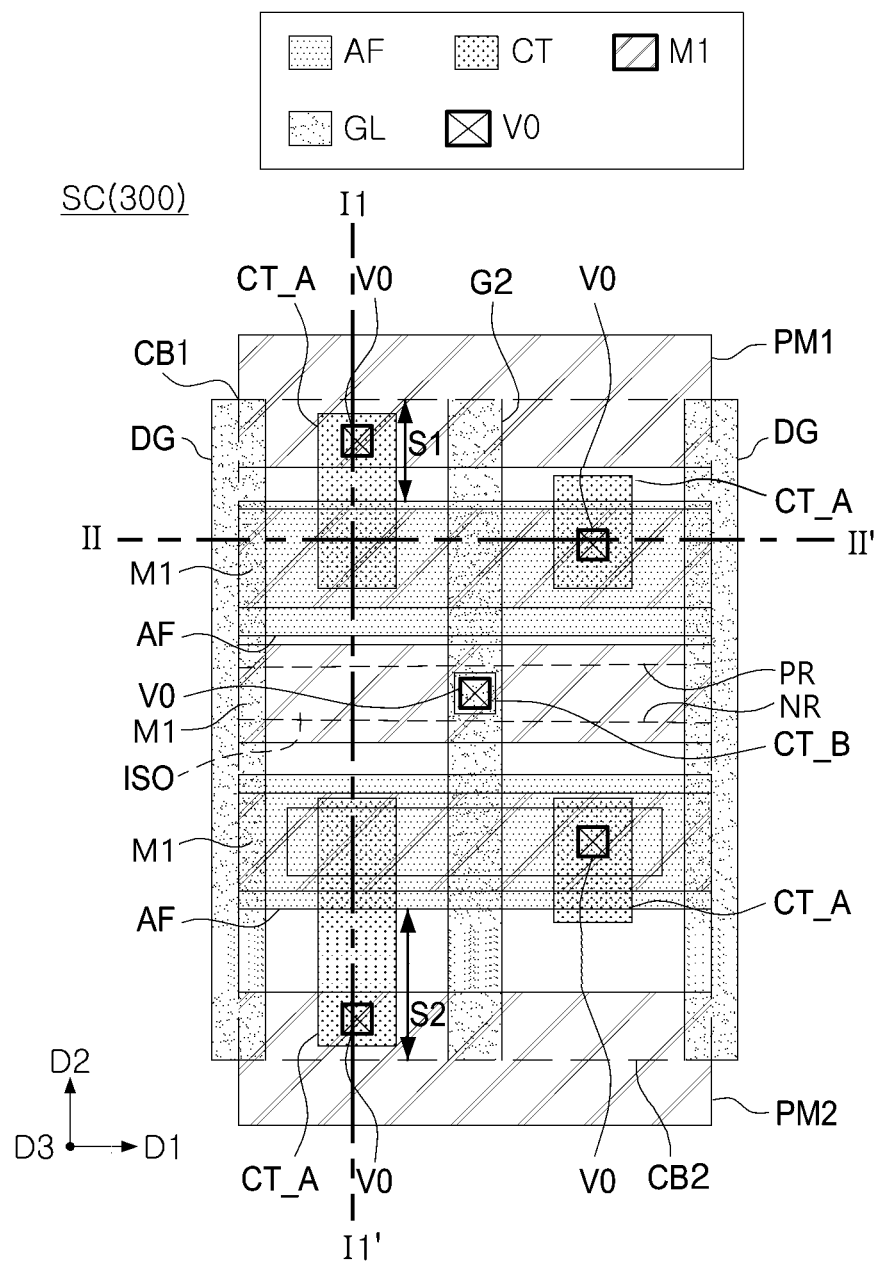

FIGS. 19A and 19B are an equivalent circuit diagram and a layout diagram of a standard cell according to an example embodiment, respectively. A layout of a standard cell SC illustrated in FIGS. 19A and 19B may include gate lines GL and DL, first and second contact structures CT_A and CT_B, first and second interconnection lines M1 and M2, and first and second power supply lines PM1 and PM2 which are added on the fin pattern layout illustrated in FIG. 18. The layout illustrated in FIG. 19B may constitute an inverter circuit of FIG. 19A.

Referring to FIG. 19A, a unit inverter circuit of the standard cell SC may include a pull-up element TR1, receiving first power VDD, and a pull-down element TR2 receiving second power VSS, and gates of the pull-up element TR1 and the pull-down element TR2 may be connected to each other to provide an input terminal IN. One of source/drain regions of the pull-up element TR1 and one of source/drain regions of the pull-down element TR2 may be connected to each other to provide an output terminal OUT. However, such an inverter circuit is only one example of unit circuits which may be provided by a standard cell, and the standard cells may provide various circuits such as NAND standard cells and NOR standard cells, other than the inverter circuit.

Referring to FIG. 19B, the standard cell SC may include a pair of active fins AF extending in a first direction D1, a gate structure GL and a dummy gate line DL extending in a second direction D2, first contact structures CT_A connected to the active fin AF and a second contact structure CT_B connected to the gate structure GL, and contact vias V0 connected to the first and second contact structures CT_A and CT_B, and first interconnection lines M1 connected to the contact vias V0.

To implement the inverter circuit of FIG. 19A, the first contact structure CT_A connected to one of a pair of active fins AF may be connected to a first power supply line PM1 through the contact via Vo, and the first contact structure CT_A connected to the other active fin AF may be connected to a second power supply line PM2 through the contact via V0.

The gate structure GL may intersect the active fins AF. The gate structure GL may provide the pull-up element TR1 and the pull-down element TR2 of the inverter circuit together with the active fin AF. In the inverter circuit of FIG. 19A, gates of the pull-up element TR1 and the pull-down element TR2 are connected to each other, and thus, the gate structure GL may be shared between a pair of active fins AF. The gate structure GL may be connected to a centrally disposed interconnection line, among the first interconnection lines M1, through a second contact structure CT_B (i.e., a gate contact).

The first interconnection lines M1 may be interconnections disposed above the active fins AF and the gate structures GL, and may extend in a first direction D1. First and second power supply lines PM1 and PM2 may be disposed on the same level as the first interconnection lines M1 and may be formed by the same process. In some embodiments, the first and second power supply lines PM1 and PM2 may be implemented as buried power supply lines or may be implemented on a higher level (for example, the second interconnection line M2). The first and second power supply lines PM1 and PM2 may be power transmission lines, respectively supplying different power supply voltages VDD and VSS to a semiconductor device, and may be electrically connected to source/drain regions on the active fins AF. The first interconnection lines M1 may be signal transmission lines through which a signal is provided to the semiconductor device, and may be electrically connected to the gate structure GL. The first and second power supply lines PM1 and PM2 may be disposed along first and second boundaries CB1 and CB2 of the standard cell SC for the unit inverter, and only half an area of each of the first and second power supply lines PM1 and PM2 may be illustrated as being disposed in the standard cell SC.

Figure 20A:
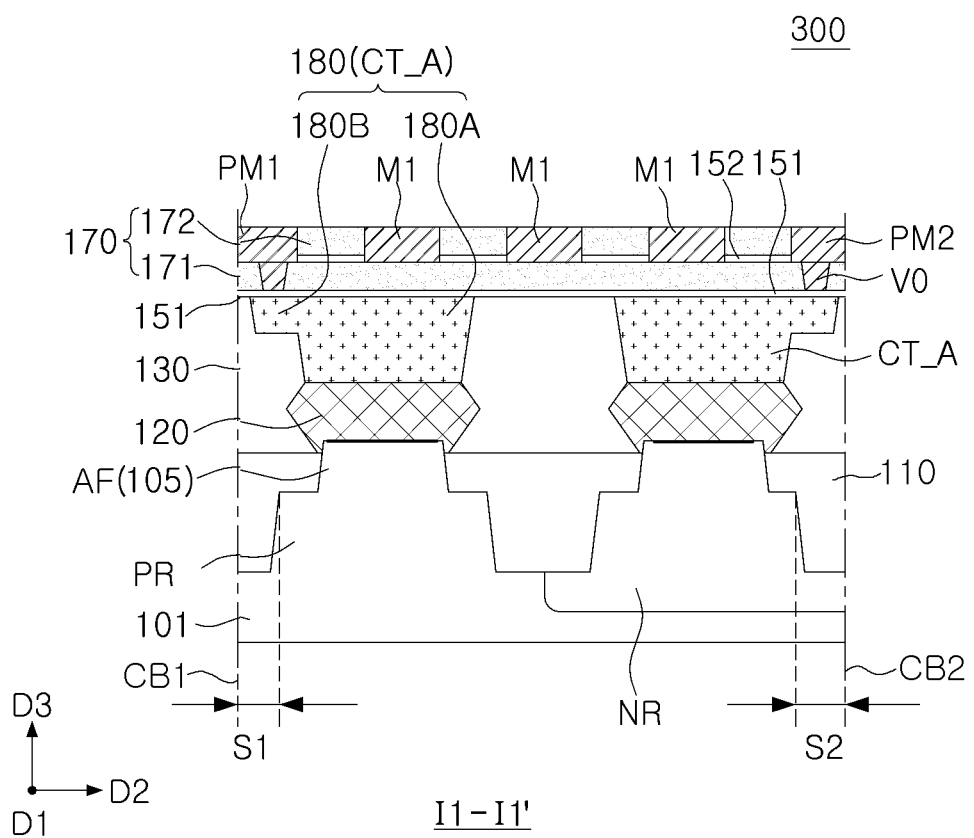
FIGS. 20A and 20B are cross-sectional views of the standard cell of FIG. 19B, taken along lines I1-I1' and II-II' of FIG. 19B, respectively.
Figure 20B:
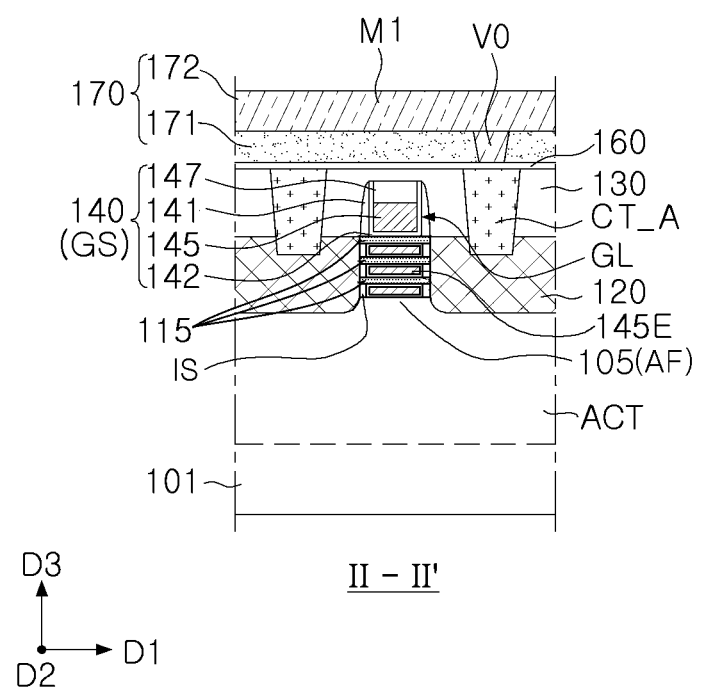

FIGS. 20A and 20B are cross-sectional views of the standard cell of FIG. 19B, taken along line I1-I1' and II-II' of FIG. 19B, respectively.

Referring to FIGS. 20A and 20B, a semiconductor device 300 according to the present embodiment may include a substrate 101, active regions 102 having active fins 105 or AF, an isolation layer 110, source/drain regions 120, a gate structure 140 or GS each having a gate electrode 145, a lower interlayer insulating layer 130, a contact structure CT_A or CT_B, an upper interlayer insulating layer 170, and first and second interconnection lines M1 and M2. As described above, the active fins AF according to the present embodiment may be spaced apart from adjacent boundaries CB1 and CB2 of the standard cell SC by predetermined distance S1 and S2. In this case, the distances S1 and S2 may be different from each other.

The semiconductor device 300 according to the present embodiment may be implemented by a transistor provided with a nanosheet (for example, MBCFET®). However, components of the present embodiment may be understood with reference to the descriptions of the components of the standard cell 100C illustrated in FIGS. 5A to 5C, unless otherwise specified or unless there is a statement in the specification to the contrary.

Referring to FIGS. 20A and 20B, the semiconductor device 300 may further include a plurality of channel layers 115, disposed to be vertically spaced apart from each other on the active fins AF, and internal spacer layers disposed to be parallel to a gate electrode 145 between the plurality of channel layers 115. The semiconductor device 300 may include transistors having a gate-all-around structure disposed between an active fin AF and the channel layers 115 and between a plurality of channel layers 115 having a nanosheet shape. For example, the semiconductor device 300 may include transistors including channel layers 115, source/drain regions 120, and gate electrodes 145.

A plurality of channel layers 115 may include two more channel layers disposed to be spaced apart from each other in a direction perpendicular to an upper surface of the active fin AF, for example, a third direction D3 on the active fin AF. The channel layers 115 may be connected to the source/drain regions 120 and may be spaced apart from upper surfaces of the active fin AF. The channel layers 115 may have the same (or similar) width as the active fin AF in a second direction D2, and may have the same (or similar) width as the gate structure 140 in a first direction D1. However, when an internal spacer IS is employed as in the present embodiment, the channel layers 115 may have widths, in the first direction D1, smaller than as the maximum width, in the first direction, of the gate structure 140.

The plurality of channel layers 115 may be formed of a semiconductor material, and may include, for example, at least one of silicon (Si), silicon-germanium (SiGe), and germanium (Ge). The channel layers 115 may be formed of, for example, the same material as the substrate 101. The number and shapes of the channel layers 115, constituting a single channel structure, may be modified in various embodiments. For example, a channel layer may be further provided in a region, in which the active fins AF are in contact with the gate electrode 145, according to example embodiments.

A gate structure GL may be disposed to intersect the active fins AF and the plurality of channel layers 115 to extend above the active fins AF and the plurality of channel layers 115. Channel region of transistor may be formed in the active fins AF and the plurality of channel layers 115 below the gate structure GL. In the present embodiment, the gate insulating layer 142 may be disposed between the active fin AF and the gate electrode 145 as well as between the plurality of channel layers 115 and the gate electrode 145. The gate electrode 145 may be disposed above the active fins AF and fill spaces between the plurality of channel layers 115. The gate electrode 145 may be spaced apart from the plurality of channel layers 115 by the gate insulating layer 142.

Internal spacers IS may be disposed to be parallel to the gate electrode 145 between the plurality of channel layers 115. The gate electrode 145 may be spaced apart from the source/drain regions 120 by the internal spacers IS to be electrically insulated therefrom. The internal spacers IS may have a flat side surface facing the gate electrode 145, or may have a shape convexly rounded inwardly of the gate electrode 145. The internal spacers IS may be formed of an oxide, or a low-k dielectric material such as a nitride and an oxynitride.

As described above, the semiconductor device according to the present embodiment may be applied to transistors having various structures and, in addition to the above-described embodiments, may be implemented as a vertical FET (VFET) having an active region extending in a direction perpendicular to an upper surface of a substrate and a gate structure surrounding the active region, or a semiconductor device including a negative capacitance FET (NCFET) using a gate insulating layer having ferroelectric characteristics.

As described above, according to example embodiments, a standard cell may include an active fin or a dummy fin has is offset from at least one boundary, among boundaries of the standard cell. In the standard cell, the fin patterns may be designed in various arrangements. A semiconductor device having improved integration density and reliability may be implemented through a combination of standard cells of a group having different cell heights.

In some standard cells, intervals between active fins (or active patterns) adjacent to first and second boundaries may be different from each other. Some standard cells may not include a dummy fin or non-flat regions in which a dummy fin is removed.

While example embodiments have been shown and described above, it will be apparent to those skilled in the art that modifications and variations could be made without departing from the scope of the present inventive concept as defined by the appended claims.

What is claimed is:

1. A semiconductor device comprising:
   a substrate having an active region;
   a first group of standard cells arranged in a first row region of the active region,
   wherein the first row region of the active region extends lengthwise in a first direction;
   a second group of standard cells arranged in a second row region of the active region,
   wherein the second row region extends lengthwise in the first direction along a first side of the first row region, and
   wherein a first boundary extends in the first direction and is formed between the first row region and the second row region;

a third group of standard cells arranged in a third row region of the active region, wherein the third row region extends lengthwise in the first direction along a second side of the first row region, wherein a second boundary extends in the first direction and is formed between the first row region and the third row region, and wherein the first side of the first row region and the second side of the first row region are opposite with each other in a second direction different from the first direction;

a first power supply line extending lengthwise in the first direction along the first boundary between the first row region and the second row region, and overlapping partially each of the first row region and the second row region; and a second power supply line extending lengthwise in the first direction along the second boundary between the first row region and the third row region, and overlapping partially each of the first row region and the third row region, wherein each of the first to third groups of standard cells comprises a plurality of transistors including a plurality of active fins which are provided with the active region, wherein the plurality of active fins protrude from a main surface of the active region and extend lengthwise in the first direction, and wherein the plurality of active fins are spaced apart from each other in the second direction without overlapping the first and second boundaries.

2. The semiconductor device of claim 1, wherein the first boundary is interposed between two adjacent active fins, wherein one of the two adjacent active fins is one of the plurality of active fins in the first row region and is spaced apart, at a first distance, from the first boundary, and wherein the other of the two adjacent active fins is one of the plurality of active fins in the second row region and is spaced apart, at the first distance, from the first boundary.

3. The semiconductor device of claim 1, further comprising:

a first dummy fin extending lengthwise in the first direction along the first boundary between the first row region and the second row region, and partially overlapping each of the first row region and the second row region.

4. The semiconductor device of claim 3, wherein the second boundary is interposed between two adjacent active fins, wherein one of the two adjacent active fins is one of the plurality of active fins in the first row region and is spaced apart, at a first distance, from the second boundary, and wherein the other of the two adjacent active fins is one of the plurality of active fins in the third row region and is spaced apart, at the first distance, from the second boundary.

5. The semiconductor device of claim 3, further comprising:

a second dummy fin disposed in the first row region and extending lengthwise in the first direction along the second boundary between the first row region and the third row region;

a third dummy fin disposed in the third row region and extending lengthwise in the first direction along the second boundary between the first row region and the third row region, wherein each of the second dummy fin and the third dummy fin is spaced apart from the second boundary at a first distance.

6. The semiconductor device of claim 1, wherein the plurality of active fins of the first row region is disposed between the first and second boundaries, and wherein the plurality of active fins of the first row region are spaced apart, in the second direction, from each other at a first pitch.

7. The semiconductor device of claim 6, wherein a first active fin of the plurality of active fins in the first row region and a second active fin of the plurality of active fins in the second row region are spaced apart, in the second direction, from each other at a second pitch which is different from the first pitch, and wherein the first active fin is an active fin, closest to the first boundary, among the plurality of active fins in the first row region, wherein the second active fin is an active fin, closest to the first boundary, among the plurality of active fins in the second row region, wherein a third active fin of the plurality of active fins in the first row region and a fourth active fin of the plurality of active fins in the third row region are spaced apart, in the second direction, from each other at the second pitch, and wherein the third active fin is an active fin, closest to the second boundary, among the plurality of active fins in the first row region, and wherein the fourth active fin is an active fin, closest to the second boundary, among the plurality of active fins in the third row region.

8. The semiconductor device of claim 7, wherein no dummy fin is present in the first row region.

9. The semiconductor device of claim 7, further comprising:

a dummy fin disposed between two adjacent active fins among the plurality of active fins in the first row region, wherein the first row region includes a first active region, and a second active region doped with a different conductivity type impurity from that of the first active region, wherein the first active region and the second active region are arranged in the second direction, and wherein the dummy fin extends lengthwise in the first direction along a boundary between the first active region and the second active region, and partially overlaps each of the first active region and the second active region.

10. The semiconductor device of claim 7, further comprising:

a first dummy fin which is disposed in the first row region and spaced apart, in the second direction, from the first boundary at a first distance;

a second dummy fin which is disposed in the second row region and spaced apart, in the second direction, from the first boundary at the first distance, wherein the first boundary is disposed between the first dummy fin and the second dummy fin;

a third dummy fin which is disposed in the first row region and spaced apart, in the second direction, from the second boundary at the first distance; and a fourth dummy fin which is disposed in the third row region and spaced apart, in the second direction, from the second boundary at the first distance, wherein the second boundary is disposed between the third dummy fin and the fourth dummy fin.

11. The semiconductor device of claim 10,
wherein the plurality of active fins in the first row region are disposed between the first dummy fin of the first row region and the third dummy fin of the first row region.

12. The semiconductor device of claim 7,
wherein the second pitch is greater than the first pitch.

13. The semiconductor device of claim 1,
wherein each of the first to third row regions of the active region comprise a first active region doped with an impurity of a first conductivity type, and a second active region doped with an impurity of a second conductivity type which is different from the first conductivity type, wherein the first active region and the second active region of each of the first to third row regions of the active region are arranged in the second direction, wherein the first boundary is disposed between a first active region of the first row region and a first active region of the second row region, wherein the second boundary is disposed between a second active region of the first row region and a second active region of the third row region, and wherein at least one first active fin of the plurality of active fins in the first row region is disposed on the first active region in the first row region, and at least one second active fin of the plurality of active fins in the first row region is disposed on the second active region in the first row region.

14. The semiconductor device of claim 13,
wherein the at least one first active fin of the plurality of active fins in the first row region includes a first active fin closest to the first boundary, wherein the at least one second active fin of the plurality of active fins in the first row region includes a second active fin closest to the second boundary, and wherein a distance between the first active fin and the first boundary is different from a distance between the second active fin and the second boundary.

15. The semiconductor device of claim 1,
wherein the first to third groups of standard cells in the first to third row regions have first to third cell heights defined in the second direction, respectively, and wherein the first cell height is different from at least one of the second and third cell heights.

16. A semiconductor device comprising:
a substrate having an active region;
a plurality of standard cells arranged in a plurality of row regions of the active region,
wherein each of the plurality of row regions extends lengthwise in a first direction, and the plurality of row regions are arranged in a second direction different from the first direction,
wherein each of the plurality of standard cells comprises a plurality of transistors including a plurality of active fins which are provided with the active region,
wherein the plurality of active fins protrude from a main surface of the active region and extend lengthwise in the first direction,
wherein each of the plurality of row regions includes a first boundary with its upper row region and a second boundary with its lower row region, and
wherein each of the first boundary and the second boundary extends lengthwise in the first direction;
a plurality of power supply lines extending lengthwise in the first direction along first and second boundaries of the plurality of row regions, and being spaced apart, in the second direction, from each other,
wherein each of the plurality of power supply lines partially overlaps each of corresponding two adjacent row regions among the plurality of row regions; and
a plurality of interconnection lines disposed above the plurality of standard cells and electrically connected to the plurality of standard cells,
wherein each of the plurality of row regions of the active region comprises a first active region doped with an impurity of a first conductivity type and a second active region doped with an impurity of a second conductivity type which is different from the first conductivity type,
wherein the first active region and the second active region of each of the plurality of row regions of the active region are arranged in the second direction,
wherein the plurality of active fins which are disposed in each of the plurality of row regions comprise a first active fin disposed in the first active region of each of the plurality of row regions, and a second active fin disposed in the second active region of each of the plurality of row regions, and
wherein a first distance between a first boundary of a first row region among the plurality of row regions and the first active fin among a plurality of active fins disposed in the first row region is different from a second distance between a second boundary of the first row region and the second active fin among the plurality of active fins disposed in the first row region.

17. The semiconductor device of claim 16,
wherein the first distance is the shortest distance among distances between the first boundary and each of the plurality of active fins disposed in the first row region, and
wherein the second distance is the shortest distance among distances between the second boundary and each of the plurality of active fins disposed in the first row region.

18. The semiconductor device of claim 16,
wherein the plurality of transistors of the plurality of standard cells further comprise a plurality of gate structures extending lengthwise in the second direction and overlapping the plurality of active fins,
wherein a plurality of first source/drain regions and a plurality of second source/drain regions are disposed in a plurality of first regions of the plurality of active fins and a plurality of second regions of the plurality of active fins, and
which the plurality of first regions and the plurality of second regions are disposed on opposite sides of each of the plurality of gate structures.

19. The semiconductor device of claim 16,
wherein the plurality of standard cells arranged in each of the plurality of row regions have the same cell height as each other, and
wherein the plurality of standard cells arranged in at least one of the plurality of row regions have a cell height different from a cell height of the plurality of standard cells arranged in another row region.

20. A semiconductor device comprising:
a substrate having an active region;
a plurality of standard cells arranged in a plurality of row regions,
wherein each of the plurality of row regions extends lengthwise in a first direction, and the plurality of row regions are arranged in a second direction different from the first direction,
wherein each of the plurality of standard cells comprises a plurality of transistors including a plurality of active fins which are provided with the active region, a plurality of gate structures, a plurality of first source/drain regions, a plurality of second source/drain regions, and a plurality of contact structures,
wherein the plurality of active fins protrude from a main surface of the active region and extend lengthwise in the first direction,
wherein the plurality of gate structures extends lengthwise in the second direction and overlap the plurality of active fins,
wherein the plurality of first source/drain regions and the plurality of second source/drain regions are disposed in a plurality of first regions of the plurality of active fins and a plurality of second regions of the plurality of active fins, respectively,
wherein the plurality of first regions and the plurality of second regions are disposed on opposite sides of each of the plurality of gate structures,
wherein the plurality of contact structures comprises a plurality of first contact structures connected to the plurality of first source/drain regions, and a plurality of second contact structures connected to the plurality of second source/drain regions;
a plurality of power supply lines extending lengthwise in the first direction along boundaries of the plurality of row regions, and disposed one by one on in the second direction,
wherein each of the plurality of power supply lines is shared by a plurality of standard cells disposed in each of corresponding two adjacent row regions among the plurality of row regions,
wherein a dummy fin is disposed in a first row region among the plurality of row regions and extends lengthwise in the first direction,
wherein the shortest distance between the dummy fin and a boundary of the first row region is smaller than the shortest distance between the boundary of the first row region and a first active fin, closest to the boundary, among a plurality of active fins in the first row region,
wherein the dummy fin is spaced apart, in the second direction, from a first power supply line among the plurality of power supply lines without overlapping the first power supply line, and
wherein the first power supply line overlaps the boundary of the first row region; and
an isolation layer covering lower portions of the plurality of active fins in each of the plurality of row regions,
wherein at least one power supply line of the plurality of power supply lines is a buried power supply line buried in the isolation layer, and
wherein an upper surface of the buried power supply line is lower than an upper surface of the isolation layer.

* * * * *